US011245396B2

(12) United States Patent
Edgar et al.

(10) Patent No.: US 11,245,396 B2
(45) Date of Patent: Feb. 8, 2022

(54) LIMITING INADVERTENT ACTUATIONS OF A TOUCHPAD

(71) Applicant: Microsoft Technology Licensing, LLC, Redmond, WA (US)

(72) Inventors: Robbie Edgar, Redmond, WA (US); Carl Edward Picciotto, Clyde Hill, WA (US); Aric Ahkeel Fitz-Coy, Seattle, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 560 days.

(21) Appl. No.: 15/978,065

(22) Filed: May 11, 2018

(65) Prior Publication Data

US 2019/0348983 A1 Nov. 14, 2019

(51) Int. Cl.
*H03K 17/96* (2006.01)
*G06F 3/0354* (2013.01)
(Continued)

(52) U.S. Cl.
CPC ......... *H03K 17/962* (2013.01); *G06F 1/1679* (2013.01); *G06F 1/1681* (2013.01);
(Continued)

(58) Field of Classification Search
CPC ...... G06F 1/1679; G06F 1/1681; G06F 3/016; G06F 3/0338; G06F 3/03547; G06F 3/0383; G06F 3/0418; H03K 17/962; H01L 41/04
See application file for complete search history.

(56) References Cited

U.S. PATENT DOCUMENTS

| 6,985,137 B2 | 1/2006 | Kaikuranta |
| 8,445,793 B2 | 5/2013 | Westerman et al. |

(Continued)

FOREIGN PATENT DOCUMENTS

| CN | 102053720 B | * 12/2014 |
| CN | 102053720 B | 12/2014 |

(Continued)

OTHER PUBLICATIONS

"International Search Report and Written Opinion Issued in PCT Application No. PCT/US2019/030507", dated Jul. 25, 2019, 12 Pages.

(Continued)

*Primary Examiner* — Amare Mengistu
*Assistant Examiner* — Jennifer L Zubajlo
(74) *Attorney, Agent, or Firm* — Wade IP Law PLLC

(57) ABSTRACT

Example systems described herein are configured to limit inadvertent actuations of a touchpad. The system may include a touchpad, mechanically-activated switch(es), a locking assembly, and a controller. The touchpad is configured to receive a touch input from a user. The mechanically-activated switch(es) are adjacent to the touchpad. The mechanically-activated switch(es) are configured to be activated when a depression force associated with the touch input exceeds a force threshold. The locking assembly is configured to selectively inhibit the touchpad from depressing the mechanically-activated switch(es) depending on whether one or more inhibiting criteria are satisfied. For instance, the inhibiting criteria may take into consideration an inferred intent of the user, an input mode of the touch input, and/or the depression force associated with the touch input.

21 Claims, 14 Drawing Sheets

(51) Int. Cl.
*G06F 3/041* (2006.01)
*G06F 1/16* (2006.01)
*H01L 41/04* (2006.01)
*G06F 3/038* (2013.01)
*G06F 3/0338* (2013.01)
*G06F 3/01* (2006.01)

(52) U.S. Cl.
CPC ............ *G06F 3/016* (2013.01); *G06F 3/0338* (2013.01); *G06F 3/0383* (2013.01); *G06F 3/03547* (2013.01); *G06F 3/0418* (2013.01); *H01L 41/04* (2013.01)

(56) References Cited

U.S. PATENT DOCUMENTS

| | | | |
|---|---|---|---|
| 8,570,280 B2 | 10/2013 | Stewart et al. | |
| 8,952,899 B2 | 2/2015 | Hotelling | |
| 9,274,660 B2 | 3/2016 | Bernstein et al. | |
| 9,619,044 B2 | 4/2017 | Tenuta | |
| 9,785,251 B2 | 10/2017 | Martisauskas | |
| 10,649,501 B1* | 5/2020 | Chen | G06F 1/1681 |
| 2004/0196268 A1* | 10/2004 | Hsu | G06F 3/03547 |
| | | | 345/173 |
| 2014/0028564 A1 | 1/2014 | Valentine et al. | |
| 2015/0009156 A1* | 1/2015 | Hsueh | G06F 1/169 |
| | | | 345/173 |
| 2015/0022960 A1* | 1/2015 | Doi | G06F 1/1656 |
| | | | 361/679.08 |
| 2016/0357296 A1 | 12/2016 | Picciotto et al. | |
| 2017/0097733 A1 | 4/2017 | Edgar et al. | |
| 2019/0212861 A1* | 7/2019 | Monson | G06F 3/04142 |

FOREIGN PATENT DOCUMENTS

| | | |
|---|---|---|
| EP | 3128393 A2 | 2/2017 |
| GB | 2402105 A | 12/2004 |
| JP | 2017059066 A | 3/2017 |

OTHER PUBLICATIONS

"Button clicks for internal touchpads and pointing sticks are not responsive while or shortly after the keyboard is used", Retrieved From: https://support.microsoft.com/en-in/help/2907018/button-clicks-for-internal-touchpads-and-pointing-sticks-are-not-respo, Retrieved Date: Mar. 9, 2018, 3 Pages.

Fitzpatrick, Jason, "How to Stop Accidental Trackpad Clicks in Windows 10 (And Other Mouse Enhancements)", Retrieved From: https://www.howtogeek.com/223404/how-to-stop-accidental-trackpad-clicks-in-windows-10-and-other-mouse-enhancements/, Jul. 23, 2015, 7 Pages.

* cited by examiner

LIMITING INADVERTENT ACTUATIONS OF A TOUCHPAD

BACKGROUND

Conventional computing devices (e.g., laptop computers) often have touchpads with a surface area that is no bigger than a credit card. Inadvertent actuation of such touchpads is relatively unlikely because the touchpads are relatively small. Additionally, a touchpad may be located near a side edge of a device, rather than near a lower edge of the device where palms or heels of a user's hands rest, further reducing a likelihood that the user's palms will inadvertently actuate the touchpad. Today, a touchpad typically is centered near a lower edge of the device. For instance, the touchpad may be positioned in alignment with the center of a spacebar and/or an axis that is centered between the F and J keys. A current trend in the marketplace is for manufacturers to provide computing devices with relatively larger touchpads (e.g., four inches in width and 3 inches in height, or larger). A relatively larger touchpad may enable a user to manipulate and navigate a cursor on a screen of the device more easily, as compared to the relatively smaller touchpads of the conventional devices. However, due to the relatively larger size of the touchpad, it has become easier for the user to inadvertently actuate the touchpad.

SUMMARY

Various approaches are described herein for, among other things, limiting inadvertent actuations of a touchpad. An actuation of a touchpad refers to a depression of a mechanically-activated switch (e.g., a dome switch) by the touchpad with a force that is greater than or equal to a force required to activate the mechanically-activated switch. An inadvertent actuation of a touchpad occurs when a user causes an actuation of the touchpad but does not intend to cause the actuation of the touchpad. For instance, the user may cause the inadvertent actuation while providing a scrolling input (e.g., using a scooping motion), providing an input using three or more fingers, resting a palm on the touchpad, or writing on the touchpad with a stylus.

A first example computing device includes a plurality of input devices, mechanically-activated switch(es), a hinge, a locking assembly, and a controller. The plurality of input devices is configured to receive one or more inputs from a user. The plurality of input devices comprises a touchpad having a touch surface that is configured to receive a touch input from the user. The mechanically-activated switch(es) are disposed adjacent to a first end of the touchpad. The mechanically-activated switch(es) are configured to be activated based at least in part on the touch input causing the touchpad to depress the mechanically-activated switch(es). The hinge is coupled to a second end of the touchpad that is opposite the first end of the touchpad. The touchpad is configured to pivot about the hinge. The locking assembly is configured to selectively mechanically inhibit (e.g., block) the activation of the mechanically-activated switch(es) by inhibiting the touchpad from pivoting about the hinge based at least in part on a control signal. The controller is configured to cause the locking assembly to mechanically inhibit the activation of the mechanically-activated switch(es) by providing the control signal to the locking assembly based at least in part on the one or more inputs of the plurality of input devices.

A second example computing device includes a plurality of input devices, mechanically-activated switch(es), a scissor mechanism, a locking assembly, and a controller. The plurality of input devices is configured to receive one or more inputs from a user. The plurality of input devices comprises a touchpad having a touch surface that is configured to receive a touch input from the user. The mechanically-activated switch(es) are positioned adjacent to the touchpad. The mechanically-activated switch(es) are configured to be activated based at least in part on the touch input causing the touchpad to depress the mechanically-activated switch(es). The scissor mechanism is coupled to a structure of the computing device and to the touchpad. The scissor mechanism comprises first and second linkages configured to be foldable at a pivoting point. The locking assembly is configured to selectively inhibit the touchpad from depressing the one or more mechanically-activated switches by inhibiting the scissor mechanism from folding depending on whether the locking assembly is actuated. The controller is configured to selectively actuate the locking assembly to inhibit the touchpad from depressing the one or more mechanically-activated switches based at least in part on the one or more inputs from the user.

In an example method for limiting inadvertent actuations of a touchpad, one or more inputs from a user are received at one or more user interfaces of a computing device. The touchpad is selectively inhibited from depressing one or more mechanically-activated switches that are disposed adjacent to a first end of the touchpad by inhibiting the touchpad from pivoting about a pivot point of a hinge that is coupled to a second end of the touchpad that is opposite the first end of the touchpad based at least in part on the one or more inputs from the user.

In another example method for limiting inadvertent actuations of a touchpad, one or more inputs from a user are received at one or more user interfaces of a computing device. A locking assembly is used to selectively inhibit the touchpad from depressing one or more mechanically-activated switches based at least in part on the one or more inputs from the one or more interfaces. For example, the touchpad may be selectively inhibited from depressing one or more mechanically-activated switches that are disposed adjacent to a first end of the touchpad by inhibiting the touchpad from pivoting about a pivot point of a hinge that is coupled to a second end of the touchpad that is opposite the first end of the touchpad based at least in part on the one or more inputs. In another example, the touchpad may be selectively inhibited from depressing one or more mechanically-activated switches that are disposed adjacent to the touchpad by inhibiting a scissor mechanism that is supporting the touch pad from folding about a pivot point based at least in part on the one or more inputs from the user. In accordance with this example, the scissor mechanism is coupled to a structure of the computing device and to the touchpad. In further accordance with this example, the scissor mechanism comprises first and second linkages configured to be foldable at the pivoting point.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter. Moreover, it is noted that the invention is not limited to the specific embodiments described in the Detailed Description and/or other sections of this document. Such embodiments are presented herein for illustrative purposes only. Additional embodiments will be apparent to persons skilled in the relevant art(s) based on the teachings contained herein.

BRIEF DESCRIPTION OF THE DRAWINGS/FIGURES

The accompanying drawings, which are incorporated herein and form part of the specification, illustrate embodiments of the present invention and, together with the description, further serve to explain the principles involved and to enable a person skilled in the relevant art(s) to make and use the disclosed technologies.

Figure 1:
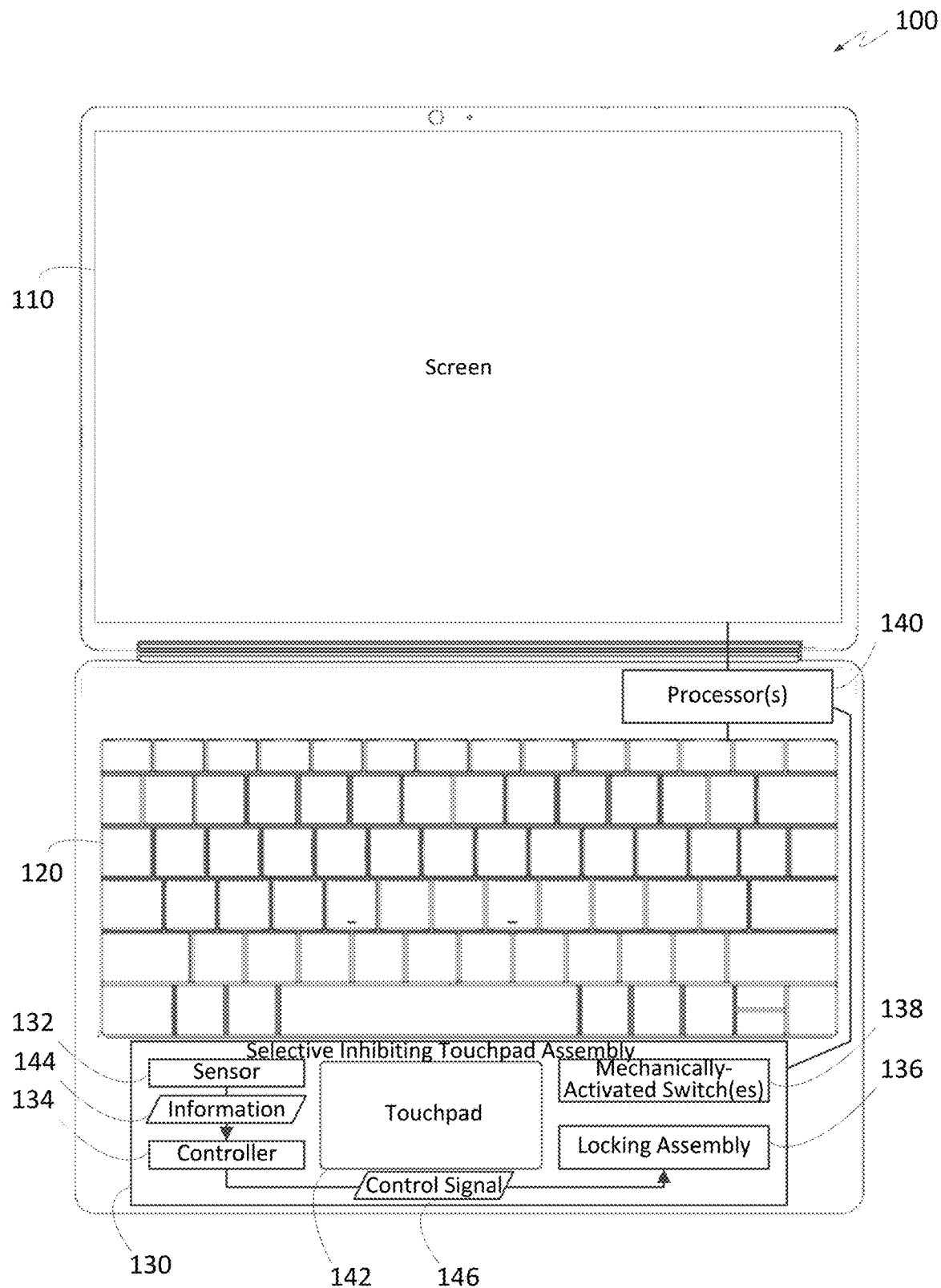
FIG. 1 is a block diagram of an example computing device in accordance with some embodiments of the present disclosure.
Figure 3A:
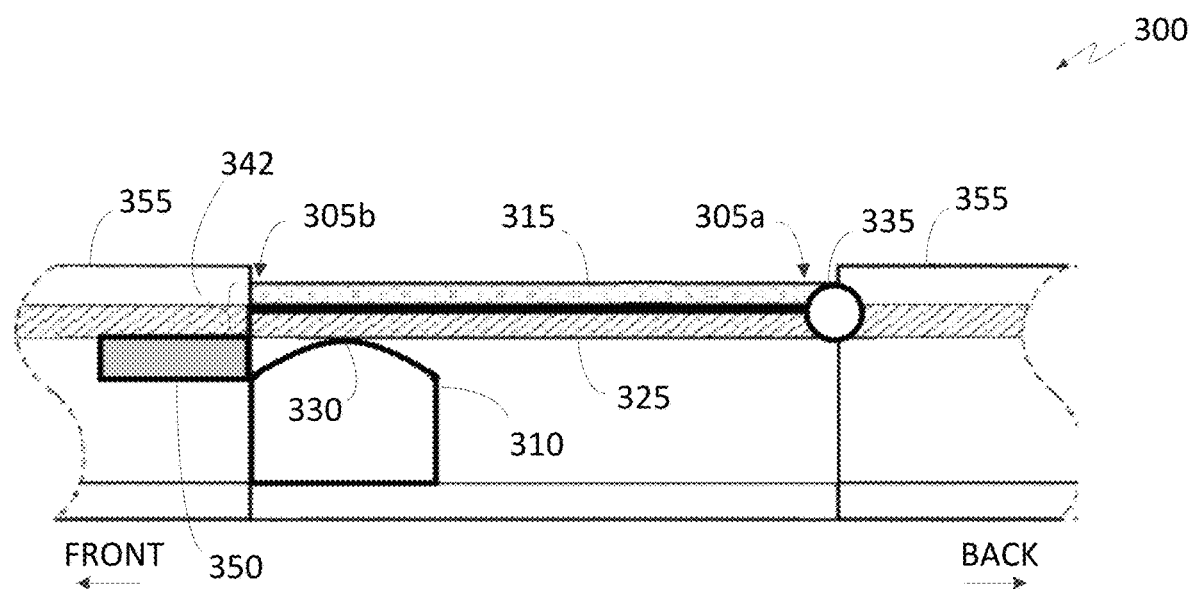
Figure 3B:
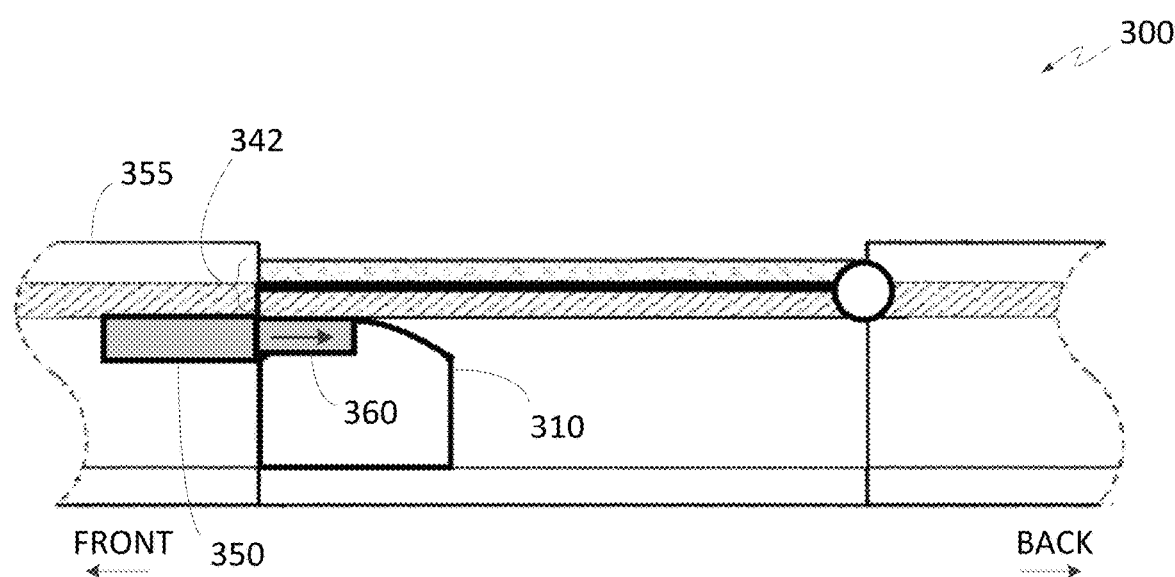
Figure 3C:
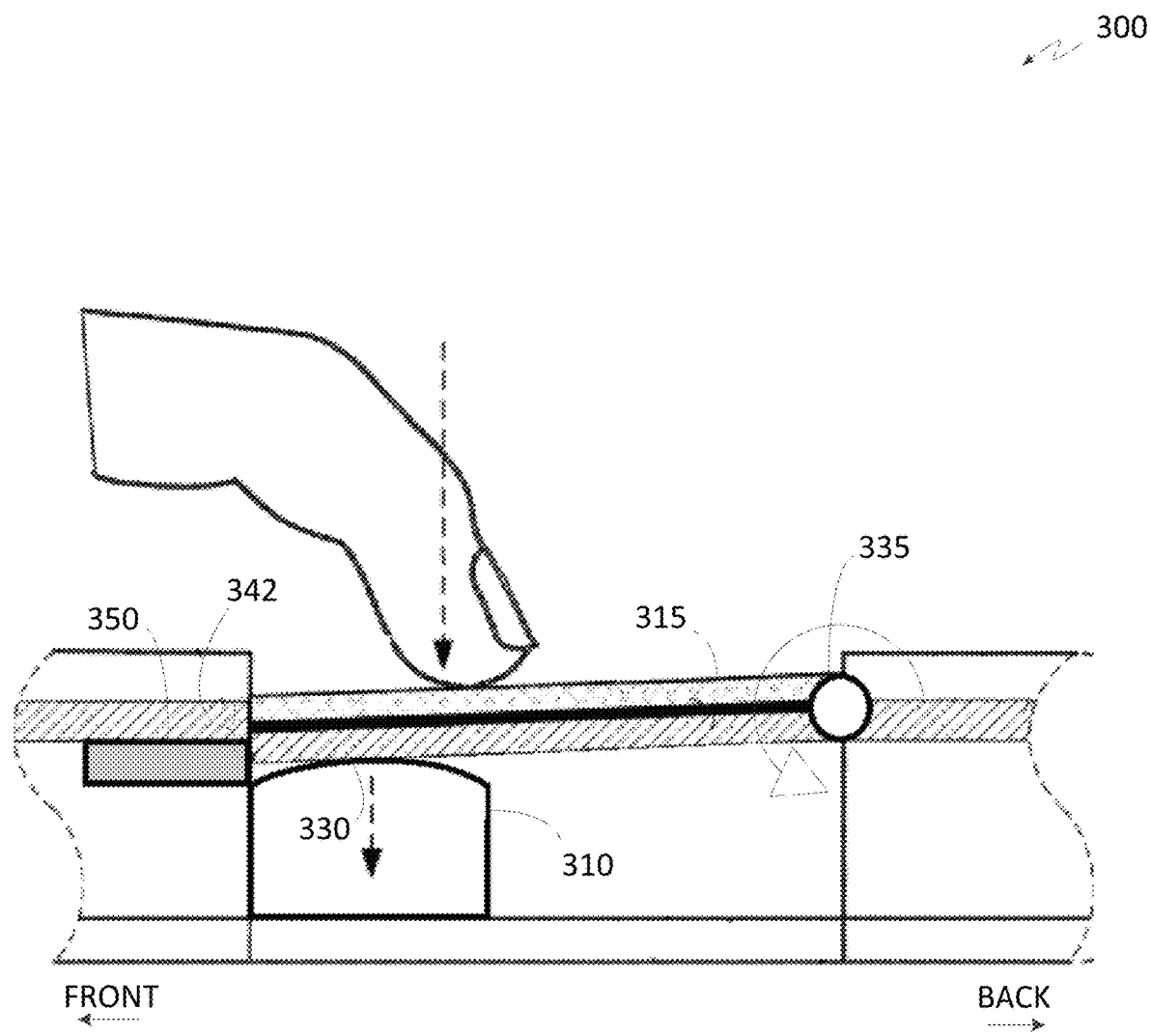

FIGS. 3A, 3B, and 3C are side views of another example implementation of a selective inhibiting touchpad assembly shown in FIG. 1 in accordance with some embodiments of the present disclosure.

Figure 4A:
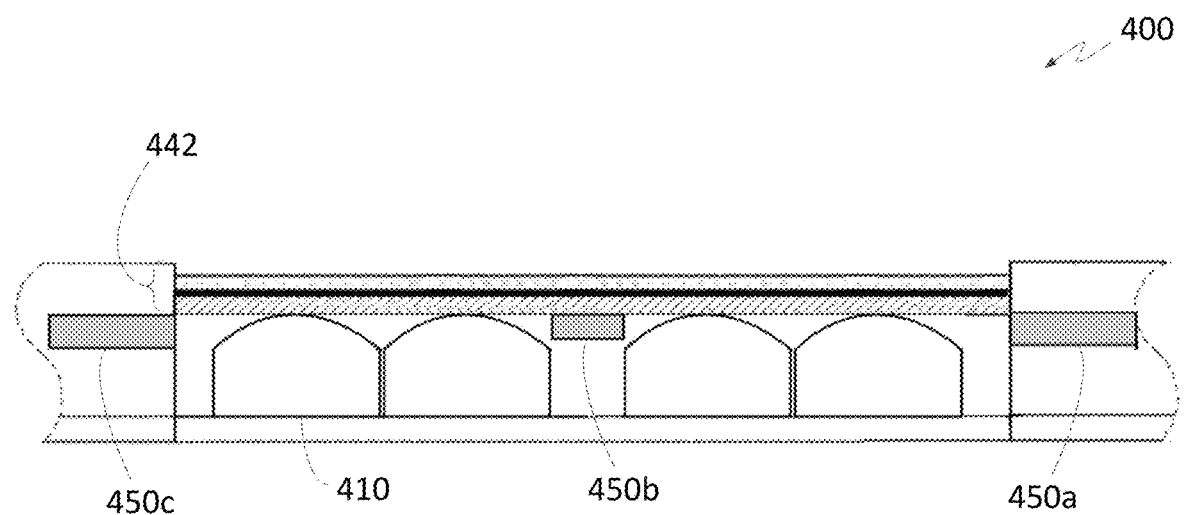
Figure 4B:
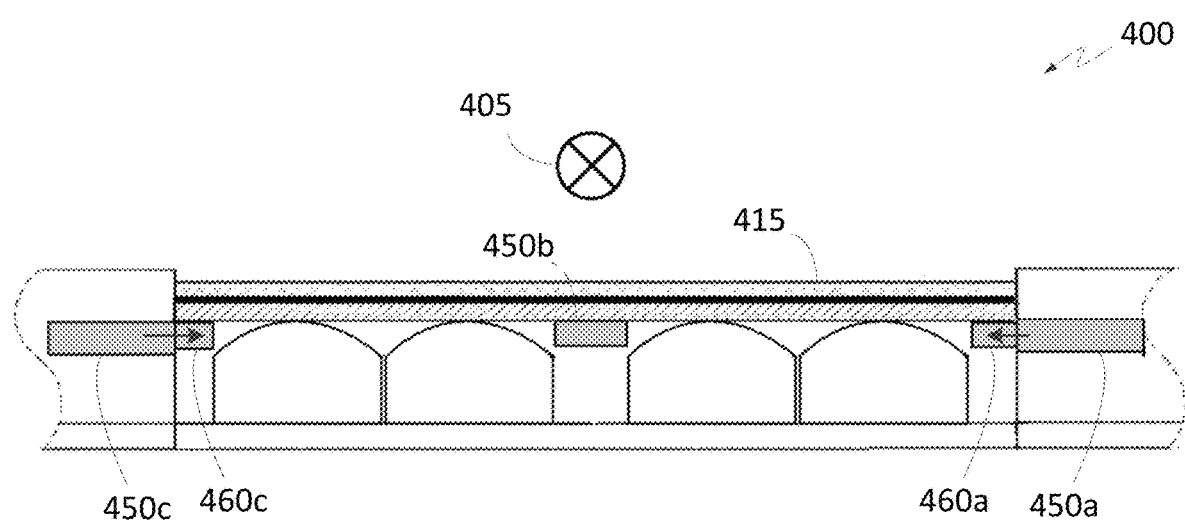

FIGS. 4A and 4B are front views of another example implementation of a selective inhibiting touchpad assembly shown in FIG. 1 in accordance with some embodiments of the present disclosure.

Figure 4C:
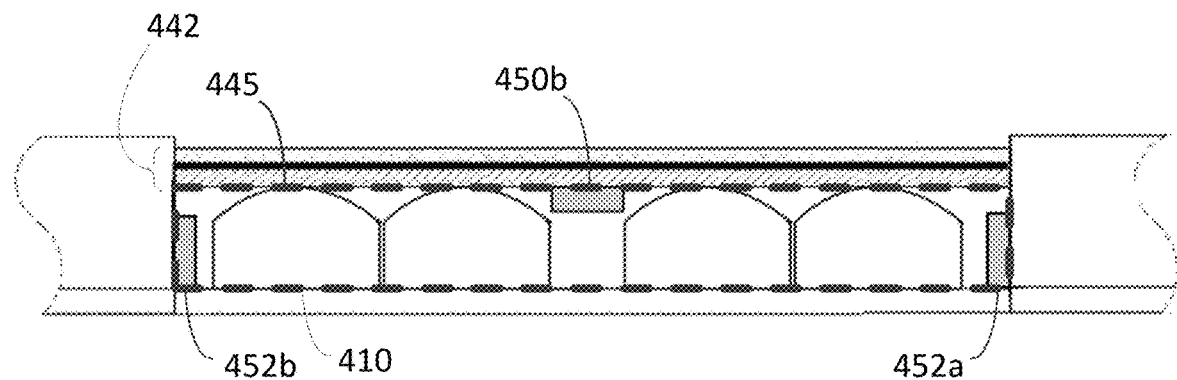
Figure 4D:
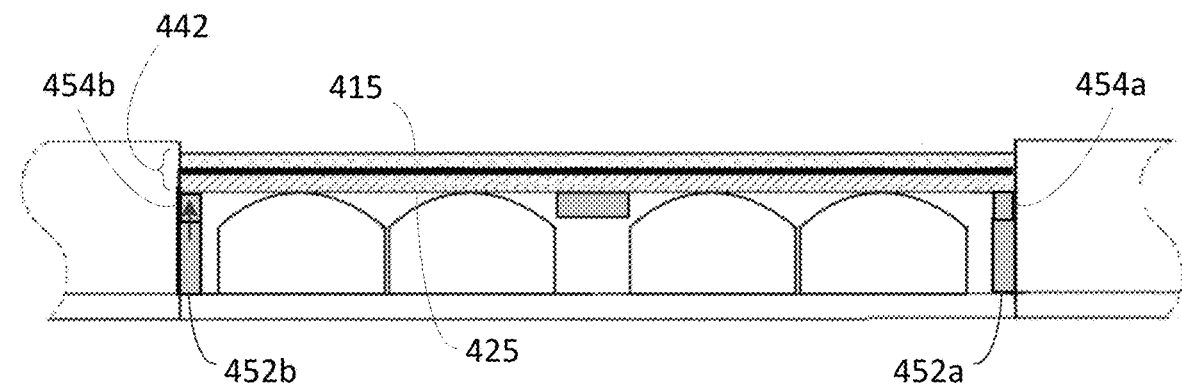

FIGS. 4C and 4D are front views of another example implementation of a selective inhibiting touchpad assembly shown in FIG. 1 in accordance with some embodiments of the present disclosure.

Figure 5:
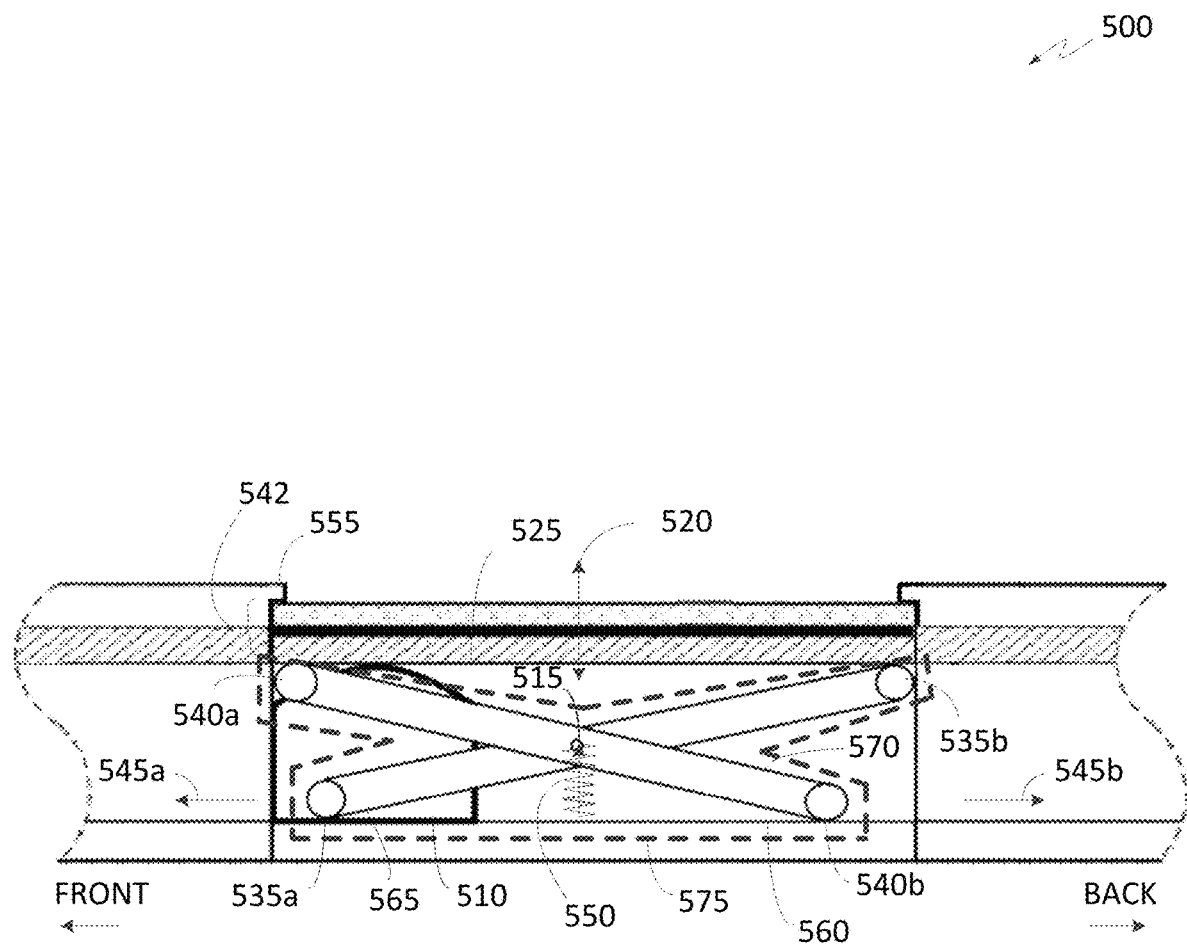

FIG. 5 is a side view of another example implementation of a selective inhibiting touchpad assembly shown in FIG. 1 in accordance with some embodiments of the present disclosure.

Figure 6A:
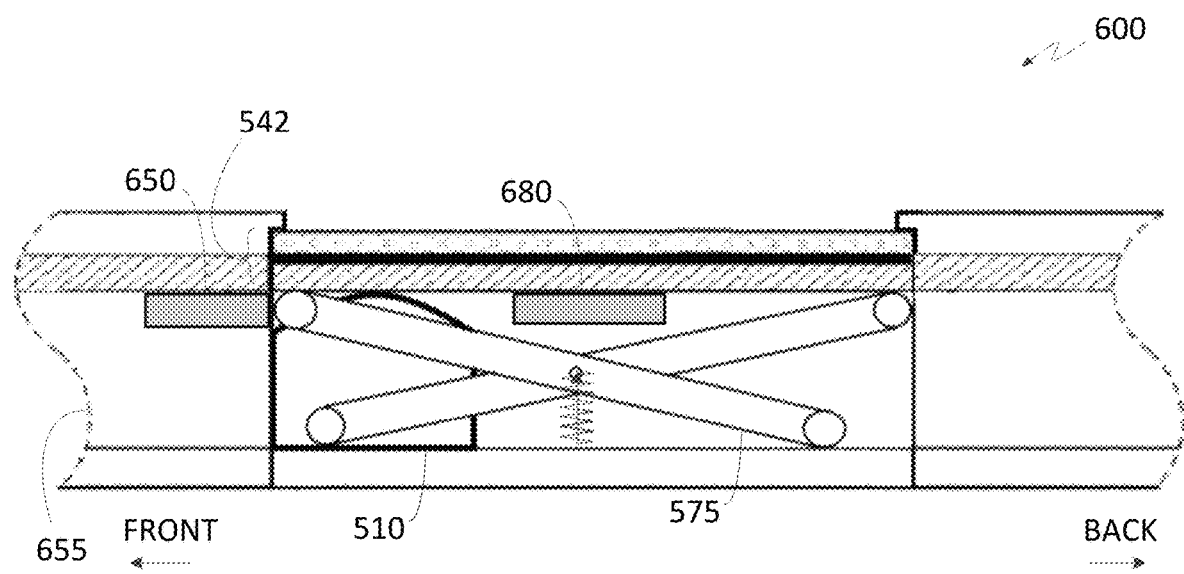
Figure 6B:
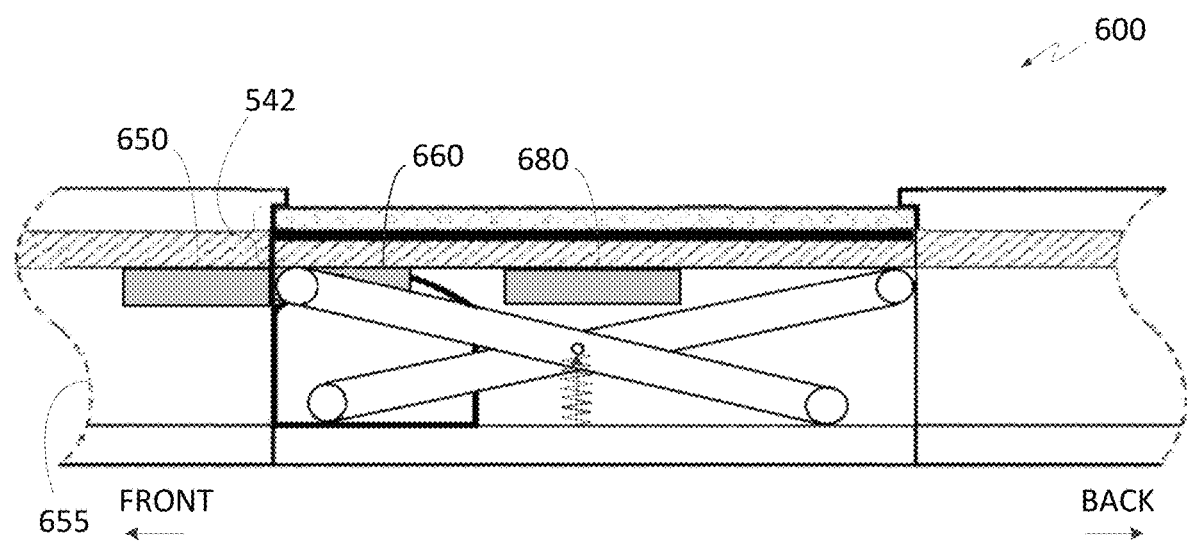

FIGS. 6A and 6B are side views of an example implementation of a selective inhibiting touchpad assembly shown in FIG. 5 including a locking assembly to lock a touchpad in accordance with some embodiments of the present disclosure.

Figure 7A:
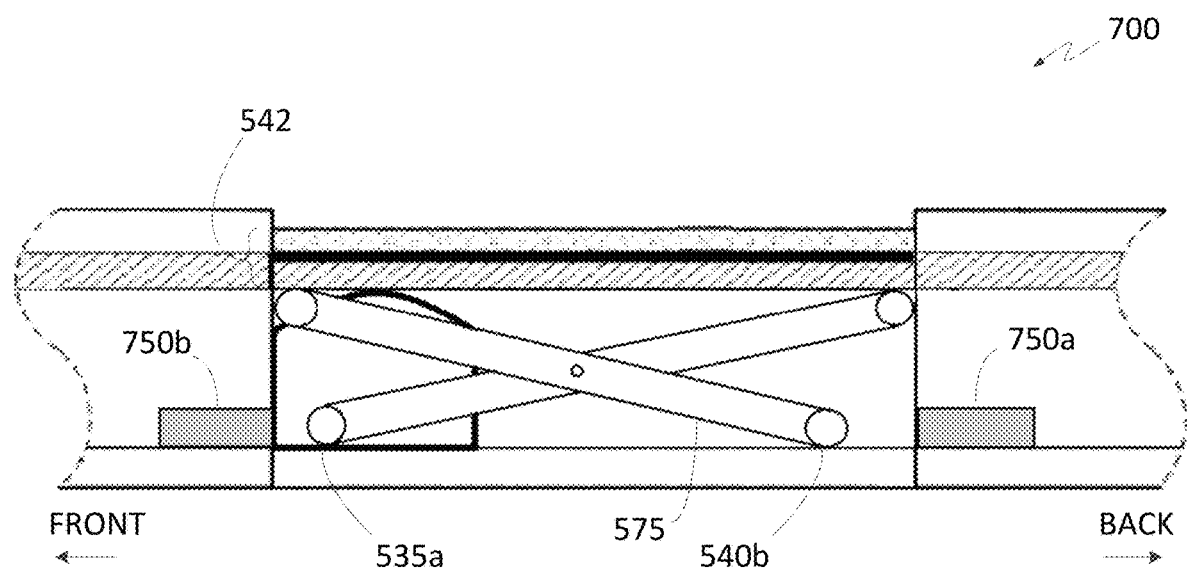
Figure 7B:
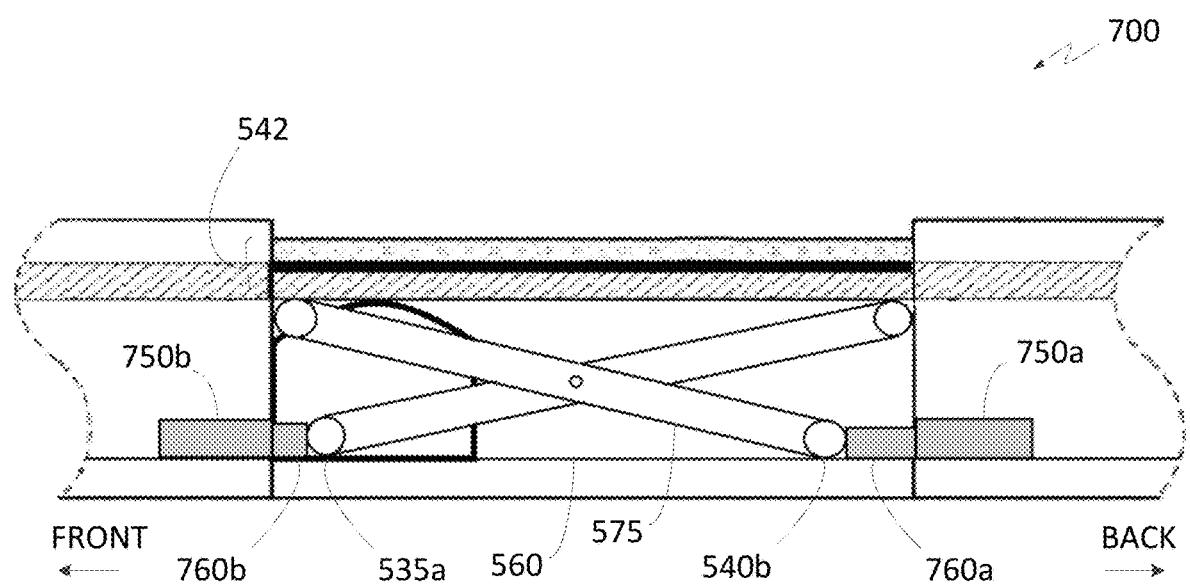

FIGS. 7A and 7B are side views of another example implementation of a selective inhibiting touchpad assembly shown in FIG. 5 including a locking assembly to lock a scissor mechanism in accordance with some embodiments of the present disclosure.

Figure 8A:
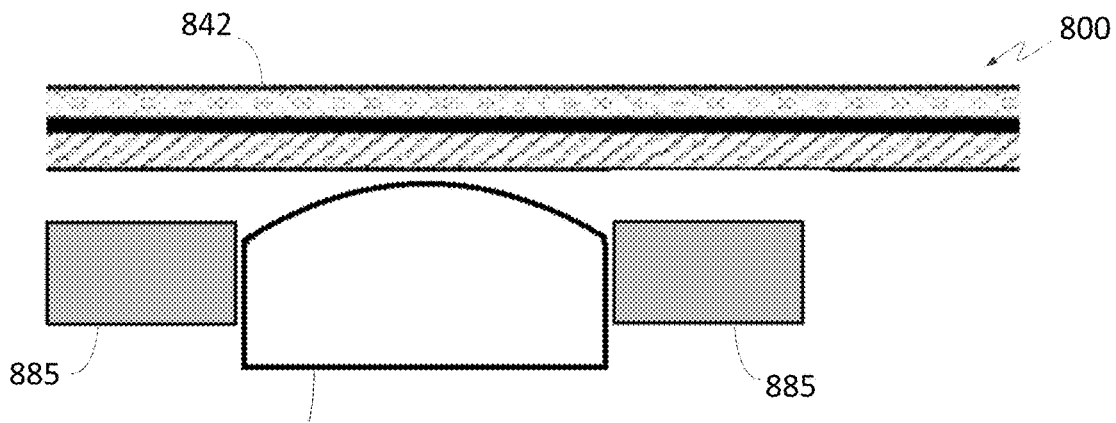
Figure 8B:
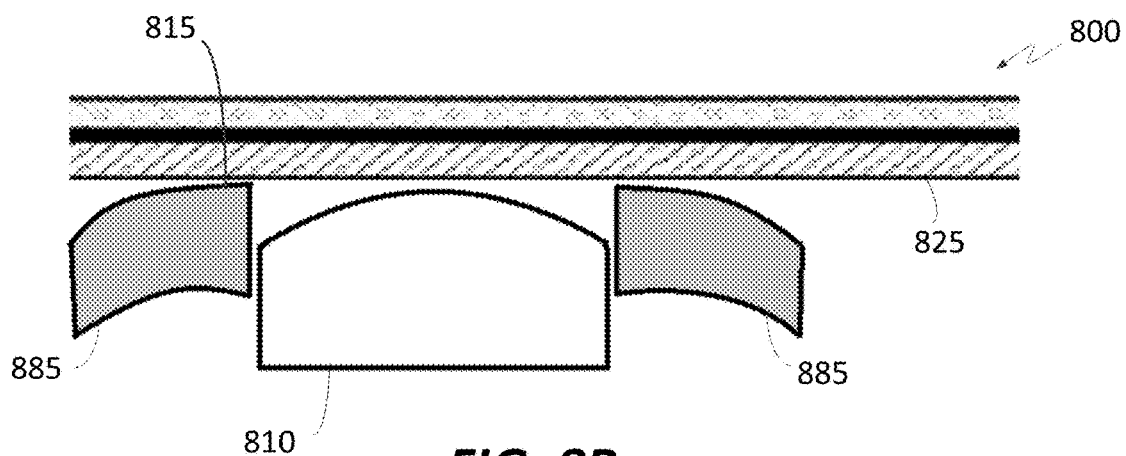

FIGS. 8A and 8B are cutout views of another example implementation of a selective inhibiting touchpad assembly shown in FIG. 1 in accordance with some embodiments of the present disclosure.

Figure 8C:
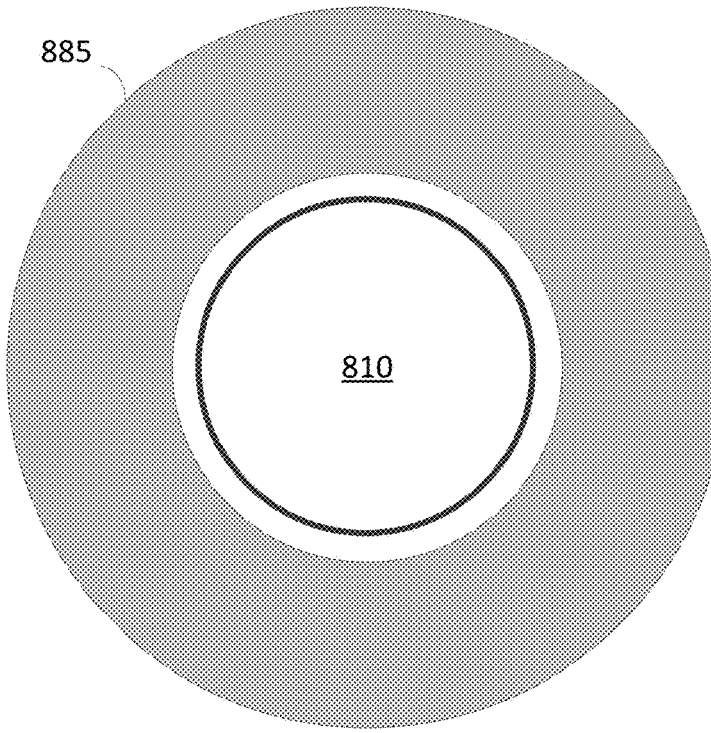

FIG. 8C is a top view of a piezoelectric structure and a switch shown in FIGS. 8A and 8B in accordance with some embodiments of the present disclosure.

Figure 9:
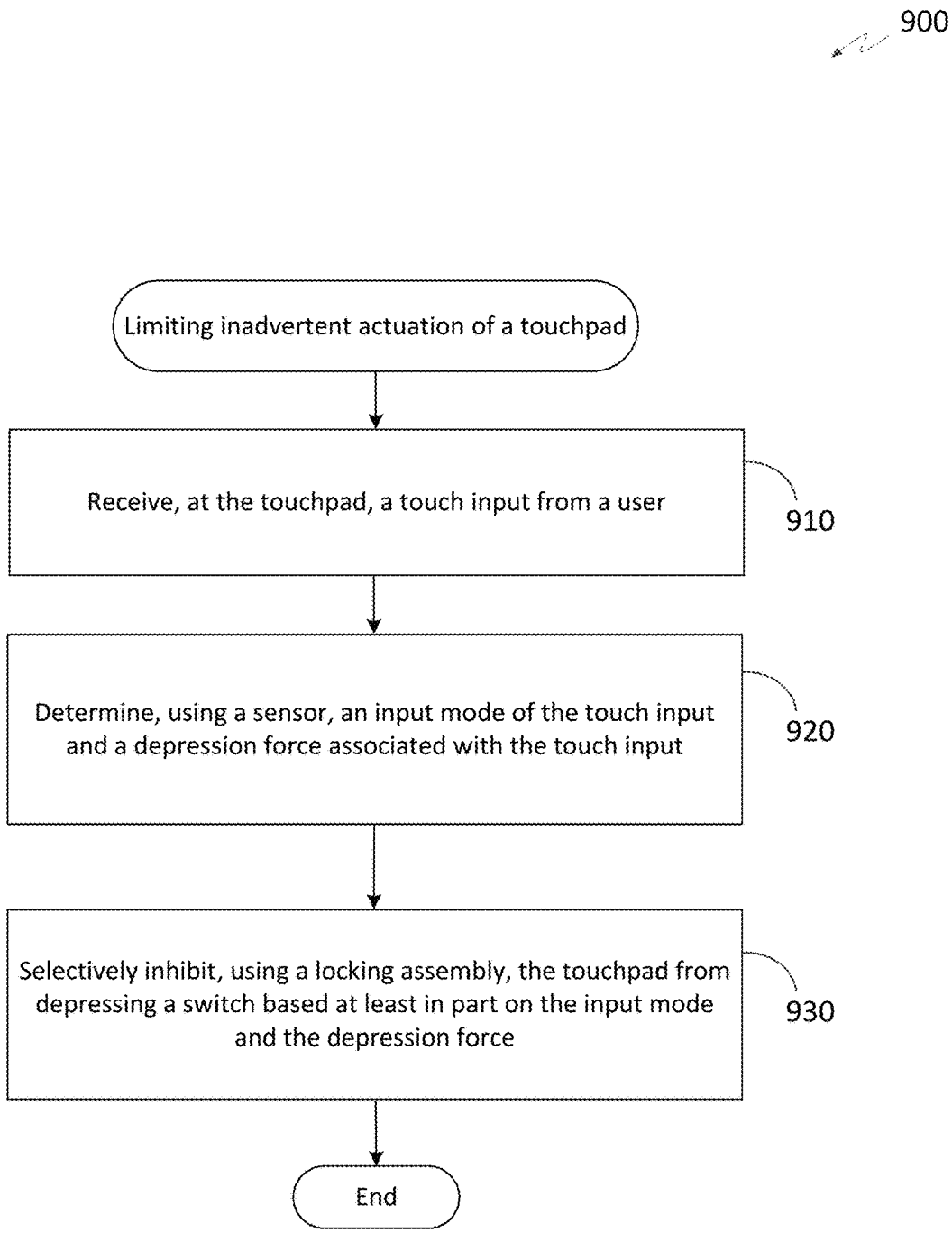
Figure 10:
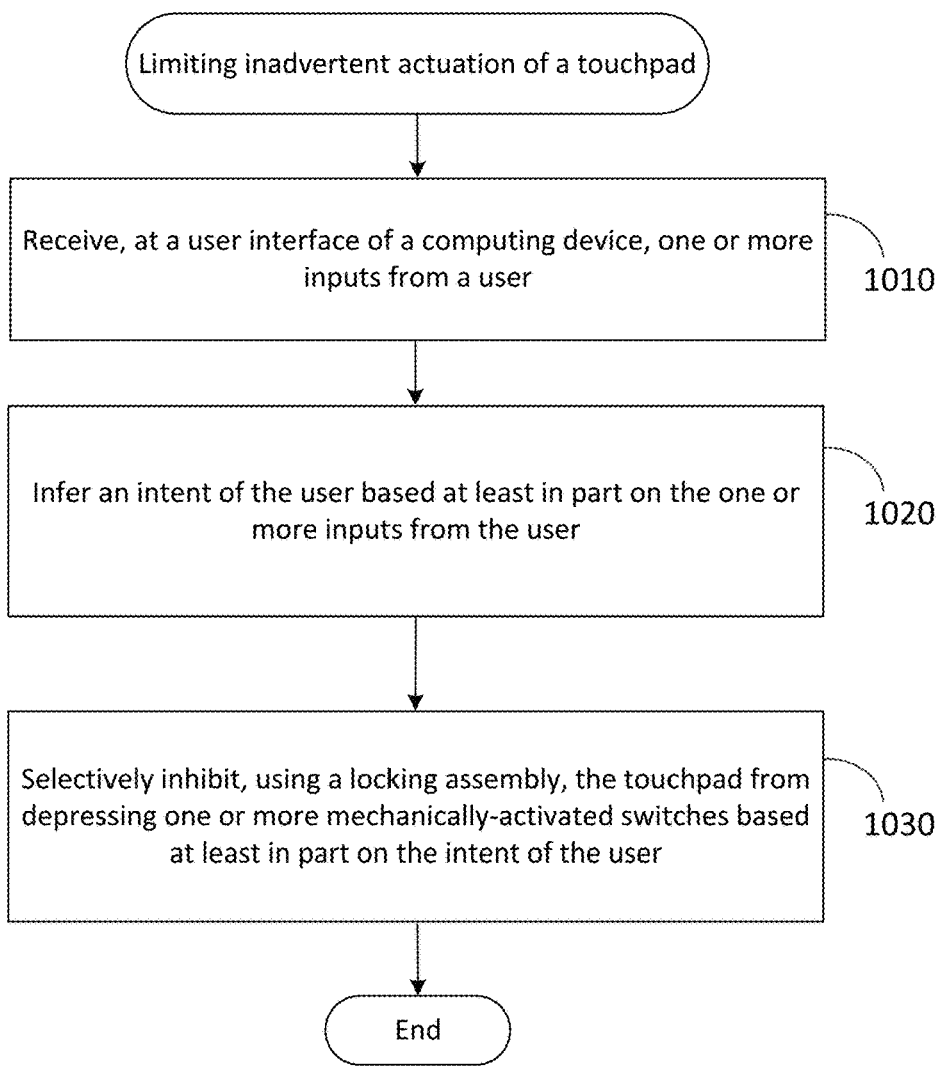
Figure 11:
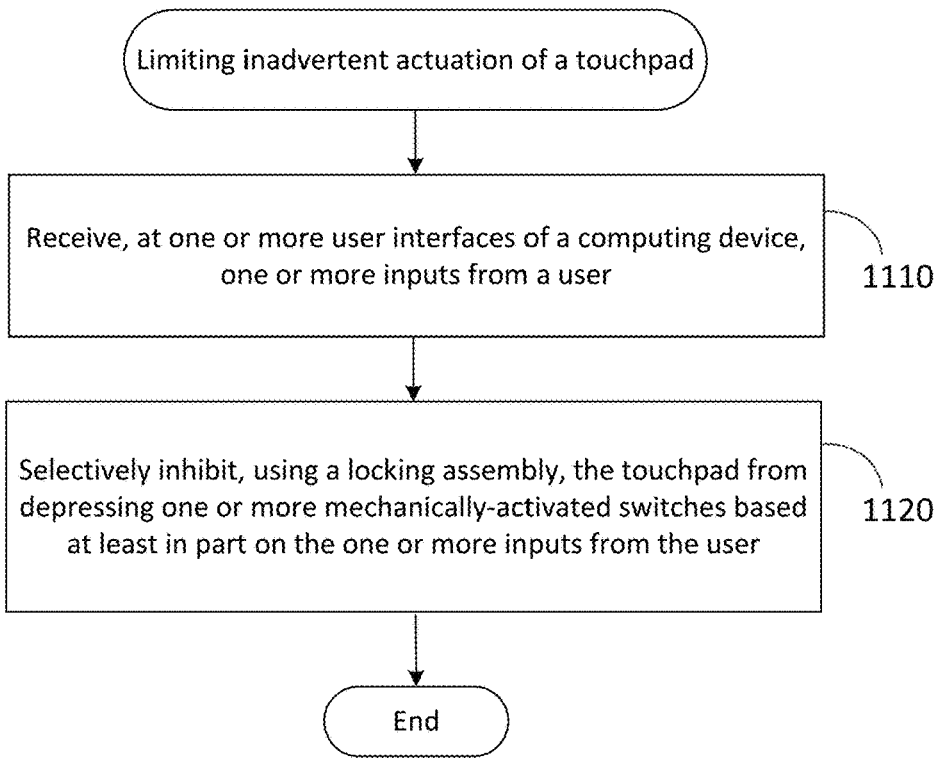

FIGS. 9, 10, and 11 depict flowcharts of example methods for limiting inadvertent actuations of a touchpad in accordance with some embodiments of the present disclosure.

Figure 12:
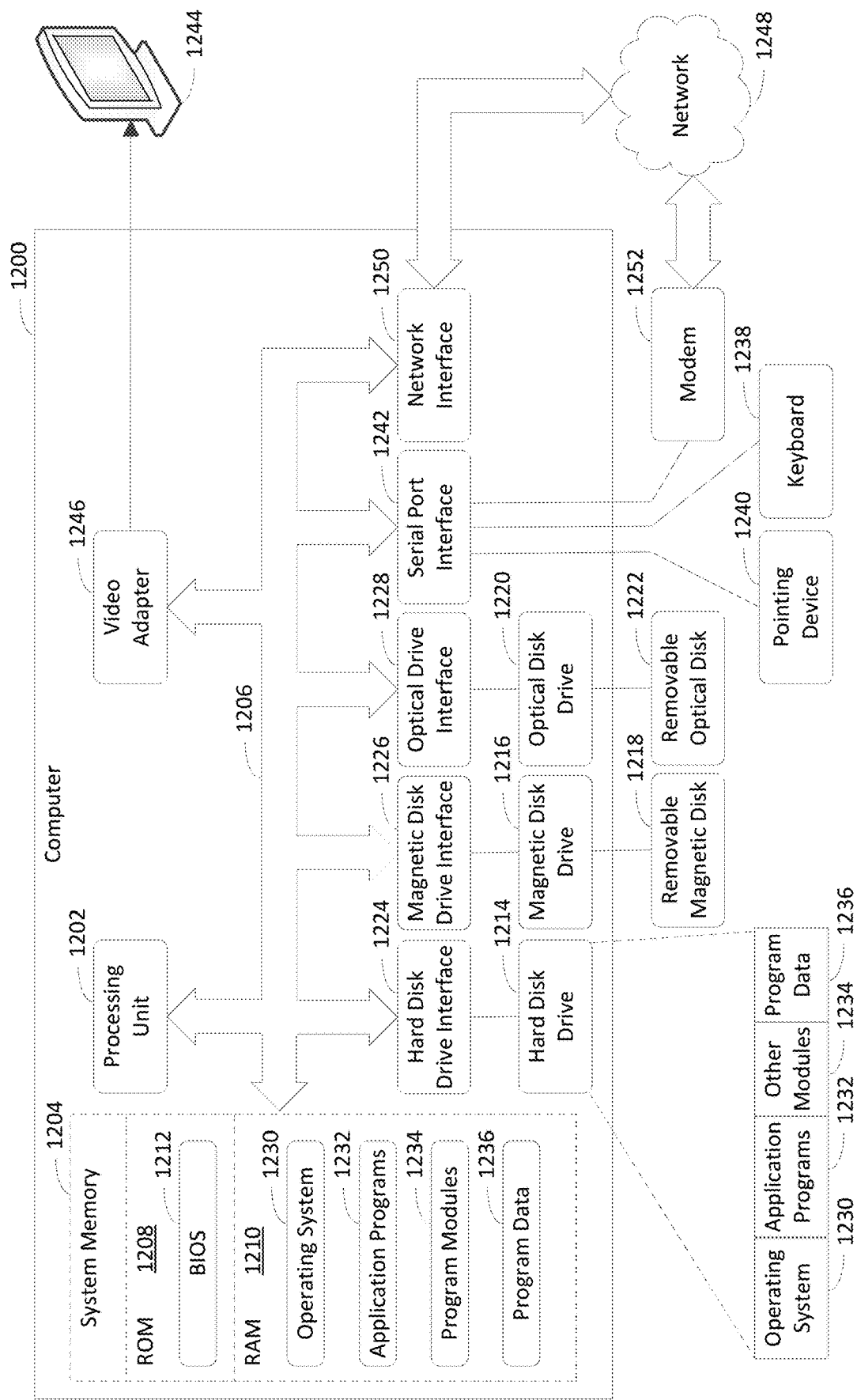

FIG. 12 depicts an example computer in which embodiments may be implemented.

The features and advantages of the disclosed technologies will become more apparent from the detailed description set forth below when taken in conjunction with the drawings, in which like reference characters identify corresponding elements throughout. In the drawings, like reference numbers generally indicate identical, functionally similar, and/or structurally similar elements. The drawing in which an element first appears is indicated by the leftmost digit(s) in the corresponding reference number.

DETAILED DESCRIPTION

I. Introduction

The following detailed description refers to the accompanying drawings that illustrate exemplary embodiments of the present invention. However, the scope of the present invention is not limited to these embodiments, but is instead defined by the appended claims. Thus, embodiments beyond those shown in the accompanying drawings, such as modified versions of the illustrated embodiments, may nevertheless be encompassed by the present invention.

References in the specification to "one embodiment," "an embodiment," "an example embodiment," or the like, indicate that the embodiment described may include a particular feature, structure, or characteristic, but every embodiment may not necessarily include the particular feature, structure, or characteristic. Moreover, such phrases are not necessarily referring to the same embodiment. Furthermore, when a particular feature, structure, or characteristic is described in connection with an embodiment, it is submitted that it is within the knowledge of one skilled in the relevant art(s) to implement such feature, structure, or characteristic in connection with other embodiments whether or not explicitly described.

Descriptors such as "first", "second", "third", etc. are used to reference some elements discussed herein. Such descriptors are used to facilitate the discussion of the example embodiments and do not indicate a required order of the referenced elements, unless an affirmative statement is made herein that such an order is required.

II. Example Embodiments

Example systems described herein are configured to limit inadvertent actuations of a touchpad (e.g., while a user is typing, while the user is interacting with a screen of a computing device (e.g., a laptop) that includes the touchpad, and/or while the user is attempting to provide a cursor-moving input on the touchpad). An actuation of a touchpad refers to a depression of a mechanically-activated switch (e.g., a dome switch) by the touchpad with a force that is greater than or equal to a force required to activate the mechanically-activated switch. An inadvertent actuation of a touchpad occurs when a user causes an actuation of the touchpad but does not intend to cause the actuation of the touchpad. For instance, the user may cause the inadvertent actuation while providing a touch input. The touch input may involve a scrolling input (e.g., using a scooping motion), an input using three or more fingers, resting a palm on the touchpad, writing on the touchpad with a stylus, or other suitable touch input (e.g., gesture input).

A touch input is an input in which object(s) (e.g., one or more fingers or a stylus) physically contact a touchscreen or a touchpad. Examples of a touch input include but are not limited to a light touch input, a clicking input, a mousing input, a scrolling input, a long-duration pressure input, and a hovering input. A light touch input is an input in which object(s) exert a force on the touchpad that is insufficient to actuate the touchpad. A clicking input is an input in which object(s) exert a force on the touchscreen or touchpad that is sufficient to actuate the touchpad, regardless whether the touchpad is prevented from actuating. A mousing input (a.k.a. a pointing input) is an input characterized by a motion that is intended to move a cursor or an interface item on a screen of a computing device using a pointing device (e.g., a touchpad, a touchscreen, a mouse, etc.). Examples of an interface item include but are not limited to a window, an icon, a virtual button, and a widget. A scrolling input is an input that causes content on a screen to move from a first location on the screen to a second location on the screen. A long-duration pressure input is an input in which object(s) exert a force on the touchscreen or the touchpad for a sustained period of time. The sustained period of time is non-instantaneous. For example, the sustained period of time may be greater than or equal to a time threshold. In accordance with this example, the time threshold may be 0.5 seconds, 1.0 seconds, or 1.5 seconds. A hovering input is an input in which object(s) hover over the touchscreen or the touchpad.

In an example implementation, a system may limit inadvertent actuations of a touchpad by inhibiting the touchpad from depressing mechanically-activated switch(es) located beneath the touchpad via actuation of one or more locking assemblies. For example, inhibiting the touchpad from depressing the mechanically-activated switch(es) may include preventing the touchpad from depressing the touchpad from depressing the mechanically-activated switch(es). In another example, inhibiting the touchpad from depressing the mechanically-activated switch(es) may include increasing a force threshold associated with the touchpad to an increased force threshold. For instance, the force threshold may indicate an amount of force associated with an input received at the touchpad that is required to cause the touchpad to depress the mechanically-activated switch(es). In accordance with this example, inhibiting the touchpad from depressing the mechanically-activated switch(es) may further include allowing the touchpad to depress the mechanically-activated switch(es) if a force of an input that is received at the touchpad exceeds the increased force threshold. In accordance with this implementation, the one or more locking assemblies can be actuated to engage a bottom surface of the touchpad, side edge(s) of the touchpad, and/or structure(s) that are in contact with the touchpad to inhibit the touchpad from moving toward the mechanically-activated switch(es) when a downward force (equal to or exceeding a threshold force) is applied to a top surface of the touchpad. The one or more locking assemblies can physically engage or move relatively close to the bottom surface of the touchpad to block a path of travel of the touchpad or resist movement of the touchpad along the path.

The example systems described herein have a variety of benefits as compared to conventional systems for disabling functionality of a touchpad. For instance, the example systems may be capable of disabling the functionality of the touchpad using hardware (e.g., in combination with software and/or firmware). The example systems may be capable of inhibiting actuation of the touchpad, which typically is not possible with conventional systems. Actuation of the touchpad may be inhibited in response to (e.g., based at least in part on) detection of a palm resting on the touchpad, a scrolling input accompanied with a clicking input, a clicking input using three or more fingers, etc. If driver settings and/or sensitivity settings of the touchpad are being used to actively block touchpad pointer and tap interactions because a user is actively typing, the system may inhibit actuation of the touchpad for the same duration that the driver and/or sensitivity settings are being used to actively block the touchpad pointer and tap interactions. The example systems may be capable of inhibiting the touchpad from actuating by using one or more locking assemblies to inhibit the touchpad from depressing mechanically-activated switch(es) located beneath the touchpad. For instance, use of one or more locking assemblies may cause the touchpad to remain rigid as an object presses against the touchpad.

The one or more locking assemblies can entirely or partially prevent the mechanically-activated switch(es) from being depressed. The depression of the mechanically-activated switch(es) causes a mechanical clicking effect to occur, which the user can sense as tactile and/or audible feedback. By preventing such feedback when the user does not intend for a click to occur, the user experience can be improved. In contrast, conventional systems do not prevent the touchpad from actuating. However, because the user does not intend nor expect a clicking event to occur, any resulting haptic feedback will lead to user confusion or at least a compromised user experience even if the clicking effect does not lead to any functional response.

The example systems can prevent the touchpad from depressing the mechanically-activated switch(es) using one or more locking assemblies disposed adjacent to the perimeter of the touchpad. The one or more locking assemblies can be disposed entirely within, partially within, or entirely outside a volume that is defined by a surface area of the touchpad extended along an axis that is perpendicular to the surface area. Each of the locking assemblies can be selectively actuated to interfere with the downward motion of the touchpad, which results from user input, based at least in part on one or more inhibiting criteria being met.

The one or more locking assemblies can be actuated using a controller that sends a control signal to the one or more locking assemblies based at least in part on the user activities, which comprise one or more inputs from a plurality of input devices. The one or more inputs can be one or more of a keyboard input, a mouse input, a camera input, a touchscreen input, a touchpad input, a processor input, an operating system input, or any combination thereof. In some embodiments, the controller can cause the one or more locking assemblies to inhibit the actuation of a touchpad based at least at least in part on (a) the one or more inputs are not from the touchpad; (b) the detection of a scrolling input, at the touchpad, and (e.g., followed by) a touch input having a force greater than or equal to a force threshold, (c) detection of a mousing or scrolling input, at the touchpad, and a long-duration pressure input having a force greater than or equal to the force threshold, (d) detection of a long-duration pressure input over an area of a touch surface of the touchpad that is greater than or equal to an area threshold, or (e) detection of three or more simultaneous pressure points on the touch surface of the touchpad.

With reference to the second example criterion mentioned above, the one or more locking assemblies can selectively inhibit the touchpad from depressing the mechanically-activated switch(es) when a scrolling input is detected along with a clicking input. This is because a scrolling input usually is not followed by a clicking input. A likely scenario is that the user inadvertently performed a scooping motion while providing the scrolling input. With reference to the fourth example criterion mentioned above, a long-duration pressure input over a relatively large surface area is likely to be caused by a palm or the heel of a hand resting on the touchpad. Accordingly, when the fourth example criterion is met, a controller may actuate the one or more locking assemblies to inhibit the touchpad from activating the mechanically-activated switch(es). With reference to the fifth example criterion mentioned above, the one or more locking assemblies may inhibit the touchpad from depressing the mechanically-activated switch(es) when three or more fingers are detected on the touchpad as it is not common for a user to execute a clicking input with three or more fingers on the touchpad. It should be recognized that other inhibiting criteria are possible and that inhibiting criteria described above are not exhaustive.

A pressure point refers to a discrete touch input. The force threshold can be 165 grams force (gf)±25 gf, though the scope of the example embodiments is not limited in this respect. For example, the force threshold can be approximately 100 gf, approximately 120 gf, approximately 140 gf, approximately 160 gf, or approximately 165 gf. In accordance with this example, the force threshold may be within ±10 gf or ±20 gf of the approximated force threshold values mentioned above. The surface area threshold can be an area equivalent to an area of two or more fingers placed on the touchpad. In one example embodiment, the surface area threshold is equivalent to an average surface area of three adult fingers placed on the touchpad.

FIG. 1 is a block diagram of an example computing device 100 in accordance with some embodiments of the present disclosure. Computing device is a processing system. An example of a processing system is a system that includes at least one processor that is capable of manipulating data in accordance with a set of instructions. For instance, a processing system may be a laptop computer or other type of computer. As shown in FIG. 1, computing device 100 includes a screen 110, a keyboard 120, a selective inhibiting touchpad assembly 130, and processor(s) 140. Screen 110 is configured to display images in response to image data received from processor(s) 140.

Keyboard 120 includes a plurality of keys that are capable of being pressed by a user of computing device 100 to provide input information for processing by processor(s) 140.

Selective inhibiting touchpad assembly 130 is configured to limit inadvertent actuations of a touchpad 142. Selective inhibiting touchpad assembly 130 includes a sensor 132, a controller 134, a locking assembly 136, mechanically-activated switch(es) 138, and touchpad 142. Sensor 132 is configured to detect object(s) that are in physical contact with touchpad 142. Sensor 132 may detect attributes of the object(s). Examples of an attribute of the object(s) include but are not limited to a direction in which the object(s) are traveling along a surface of touchpad 142, a force with which the object(s) press on touchpad 142, and a number of the object(s) that are in physical contact with touchpad 142. Sensor 132 may detect an input mode associated with a user input. The input mode corresponds to a type of user input that is received at touchpad 142. For instance, the input mode may be a light touch input mode, a mousing input mode, a scrolling input mode, a clicking input mode, a multi-point (e.g., multi-finger) input mode, a long-duration pressure input mode, or any combination thereof. Sensor 132 may generate information 144 to indicate that the object(s) are in physical contact with touchpad 142, to indicate one or more of the attribute(s) of the object(s), and/or to indicate the input mode associated with the user input.

Sensor 132 can include any suitable type of sensor, including but not limited to a capacitive sensor, a resistive sensor, and/or a force sensor. A capacitive sensor can be configured to detect the presence of object(s) (finger(s), a palm, or a stylus) by detecting changes in the electric field of touchpad 142. A resistive sensor can be configured to detect the presence of object(s) by detecting changes in one or more voltage gradients of touchpad 142. A force sensor can be a piezoelectric sensor configured to measure changes in force and/or pressure being applied to a touch surface (i.e., the topmost surface) of touchpad 142.

Controller 134 is configured to control locking assembly 136. For instance, controller 134 may generate a control signal 146 to control locking assembly 136. Controller 134 may generate control signal 146 based at least in part on satisfaction of one or more inhibiting criteria. For instance, controller 134 may generate control signal 146 based at least in part on information 144 received from sensor 132. Examples of inhibiting criteria include but are not limited to three or more fingers being used to interact with touchpad 142, a palm resting on touchpad 142, a scrolling input accompanied by an excessive downward force and/or a scooping motion. Controller 134 providing control signal 146 to locking assembly 136 may cause locking assembly 136 to be actuated. Control signal 134 not providing control signal 146 to locking assembly 136 may cause locking assembly 136 to not be actuated. Controller 134 can include hardware, software, firmware, or any combination thereof. Controller can be implemented using one or more of processor(s) 140.

Locking assembly 136 is configured to selectively inhibit touchpad 142 from depressing mechanically-activated switch(es) 138 based at least in part on control signal 146. For example, locking assembly 136 may be configured to actuate, causing locking assembly 136 to inhibit touchpad 142 from depressing mechanically-activated switch(es) 138, when control signal 134 is received. In accordance with this example, inhibiting touchpad 142 from depressing mechanically-activated switch(es) 138 may inhibit a physical click that results from depression of mechanically-activated switch(es) 138 (e.g., in scenarios in which the user does not intend and/or expect to generate a clicking input). In another example, locking assembly 136 may be configured to not actuate, causing locking assembly 136 to not inhibit touchpad 142 from depressing mechanically-activated switch(es) 138, when control signal 134 is not received. Locking assembly 136 may include a latch, a flange, a piezoelectric element or surface, or a combination thereof, though the scope of the example embodiments is not limited in this respect.

Mechanically-activated switch(es) 138 are configured to be activated based at least in part on the user input causing touchpad 142 to depress mechanically-activated switch(es) 138 with a force that is greater than or equal to a force threshold.

Touchpad 142 is configured to receive a touch input (e.g., a light touch input, a clicking input, a mousing input, a scrolling input, and/or a long-duration pressure input) from a user. For instance, touch pad 142 may be a pointing device that is configured to translate position and motion of object(s) (e.g., a user's finger(s) or a stylus) along a surface of touchpad 142 into position and motion of a cursor on screen 110. Accordingly, to move a cursor displayed on screen 110, the user can interact with touchpad 142 to provide a mousing input, for example. To select or click on an object displayed on screen 110, the user can press down on the touch surface of touchpad 142 with a force that exceeds a force threshold (e.g., 170 gf) to generate a clicking input.

Processor(s) 140 are configured to execute computer-readable instructions to perform operations. For example, the processor(s) 140 may execute such computer-readable instructions to control locking assembly 136. In accordance with this example, processor(s) 140 may include controller 134 or a portion thereof. Processor(s) 140 may be configured to generate image data based on (e.g., based at least in part on) user input that is received via keyboard 110 and/or touchpad 142. Processor(s) 140 may provide the image data to screen 110 for generating images based on the image data.

It will be recognized that computing device 100 may not include one or more of screen 110, keyboard 120, selective inhibiting touchpad assembly 130, sensor 132, controller 134, locking assembly 136, mechanically-activated switch(es) 138, processor(s) 140, and/or touchpad 142. Furthermore, computing device 100 may include components in addition to or in lieu of screen 110, keyboard 120, selective inhibiting touchpad assembly 130, sensor 132, controller 134, locking assembly 136, mechanically-activated switch(es) 138, processor(s) 140, and/or touchpad 142.

Figure 2:
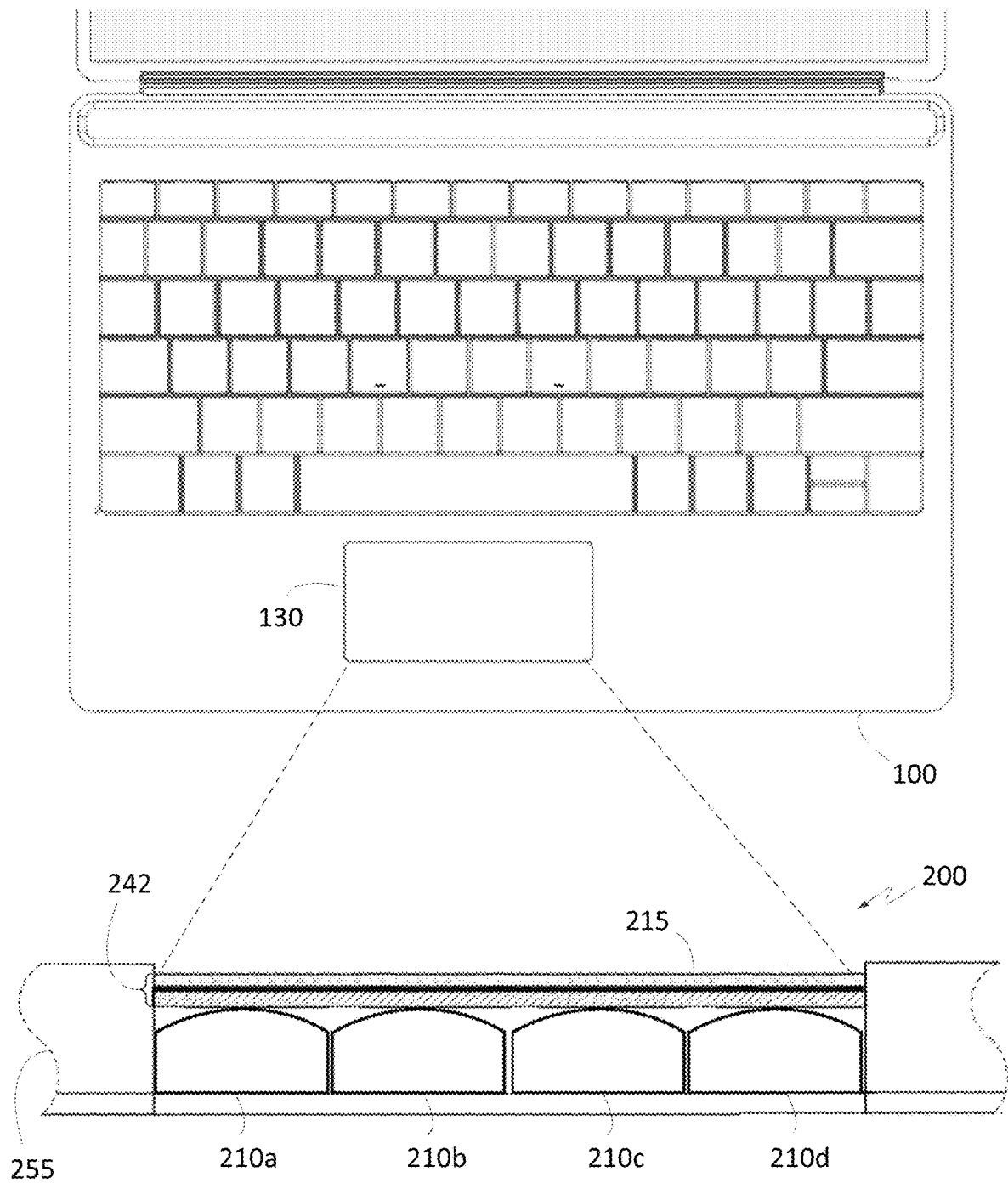
FIG. 2 is a front view of an example implementation of a selective inhibiting touchpad assembly shown in FIG. 1 in accordance with some embodiments of the present disclosure.

FIG. 2 is a front view of an example selective inhibiting touchpad assembly 200, which is an example implementation of a selective inhibiting touchpad assembly 100 shown in FIG. 1, in accordance with some embodiments of the present disclosure. Selective inhibiting touchpad assembly 200 includes touchpad 142, a plurality of mechanically-activated switches 210a-210d, and a structure 155. Mechanically-activated switches 210a-210d may be disposed near one of the sides of touchpad 142, though the scope of the example embodiments is not limited in this respect. It will be recognized that mechanically-activated switches 210a-210d may be disposed at any suitable locations at which depression of touchpad 142 is capable of activating mechanically-activated switches 210a-210d. In one embodiment, each mechanically-activated switch 210 is a dome switch that produces a haptic feedback in the form of a mechanical click. For instance, the mechanical click may be associated with a designated function (e.g., a left-button mouse click or a right-button mouse click). Selective inhibiting touchpad assembly 200 is shown in FIG. 2 to include four mechanically-activated switches 210a-210d for non-limiting, illustrative purposes. It will be recognized that selective inhibiting touchpad assembly 200 may include any suitable number (e.g., 1, 2, 3, 4, or 5) of mechanically-activated switches 210.

Touchpad 142 has a touch surface 215 that is configured to receive a touch input from a user. Touchpad 142 may include sensor(s) configured to sense the touch input from the user, though such sensor(s) may be external to touchpad 142. For instance, the sensor(s) may perform capacitive sensing, resistive sensing, and/or force sensing, each of which is well known to one skilled in the art. In one example embodiment, touchpad 142 is hingedly coupled to structure 255. For instance, one end of touchpad 142 may be hingedly coupled to structure 255. In another example embodiment, touchpad 142 is floated over switches 210a-210d using linkages. For instance, touchpad 142 may be floated over switches 210a-210d by a scissor mechanism that includes such linkages. Some example embodiments in which touchpad 142 is hingedly coupled to a structure are discussed in further detail below with reference to FIGS. 3A-3C. Some example embodiments in which touchpad 142 is floated over switches using linkages are discussed in further detail below with reference to FIGS. 5, 6A-6B, and 7A-7B.

FIGS. 3A, 3B, and 3C are side views of an example selective inhibiting selective inhibiting touchpad assembly 300, which is another example implementation of a selective inhibiting touchpad assembly 100 shown in FIG. 1, in accordance with some embodiments of the present disclosure. As shown in FIG. 3A, selective inhibiting touchpad assembly 300 includes one or more switches 310, a touchpad 342, a hinge 335, and a locking assembly 350. Touchpad 342 has a first end 305a and a second end 305b. Hinge 335 hingedly couples first end 305 of touchpad 342 to a structure 355. For instance, structure 355 may provide structural support for hinge 335. In an example embodiment, touchpad 342 is hingedly coupled to structure 355 using a flexible substrate that can span an entire length of touchpad 342. In another example embodiment, second end 305b of touchpad 342 is floated over switch(es) 310. In an aspect of this embodiment, second end 305b can be in physical contact with a top (e.g., dome or top-most) portion 330 of switch(es) 310, as shown in FIG. 3A. In another aspect of this embodiment, a bottom surface 325 of touchpad 342 and top portion 330 of switch 310 can be separated by a spaced distance (i.e., a gap).

Each of switch(es) 310 can be configured to activate when the respective switch experiences a depression force exceeding a force threshold. In one embodiment, the force threshold is in a range between 140 gf and 190 gf. In operation, a user can interact with touch surface 315 of touchpad 342 to provide a touch input. If the touch input includes a clicking input having a downward force that exceeds the force threshold, switch(es) 310 can be activated such that top portion 330 of switch(es) 310 collapses to generate a clicking effect (e.g., an audible and/or tactile snap). For instance, the clicking effect may be associated with a computer function (e.g., a left-button mouse click). An example illustration of top portion 330 of switch(es) 310 being collapsed is shown in FIG. 3C. It will be recognized that touchpad 342 may be "pre-loaded," such that touchpad 342 partially collapses switch(es) 310 in a steady state. For example, switch(es) 310 may be collapsed approximately 30% in the steady state. In accordance with this example, activation of switch(es) 310 can cause switch(es) 310 to collapse more than 30%.

Locking assembly 350 is configured to inhibit touchpad 342 from depressing switch(es) 310. By inhibiting touchpad 342 from depressing switch(es) 310, locking assembly 350 may inhibit an inadvertent activation of switch 310 and a corresponding haptic feedback. Locking assembly 350 is shown in FIG. 3A in a non-actuated state. In the non-actuated state, locking assembly 350 does not inhibit touchpad 342 from depressing switch(es) 310. Locking assembly 350 is described as including a single locking assembly for non-limiting, illustrative purposes. It will be recognized that locking assembly 350 may include any suitable number (e.g., 1, 2, 3, 4, or 5) of locking assemblies. For instance, any one or more of the locking assemblies may be disposed at second end 305b of touchpad 342 (e.g., along an edge of touchpad 342 at second end 305b). As shown in FIG. 3A, locking assembly 350 can be coupled a structure 355 near second end 305b of touchpad 342. For instance, structure 355 may provide structural support for locking assembly 350.

FIG. 3B illustrates locking assembly 350 in an actuated state. In the actuated state, locking assembly 350 inhibits touchpad 342 from depressing switch(es) 310. For example, once an inhibiting event is detected (i.e., one or more inhibiting criteria are satisfied), a controller (e.g., controller 134) may cause locking assembly 350 to actuate an inhibiting element 360. In accordance with this example, inhibiting element 360 may be configured to extend into an interior of selective inhibiting touchpad assembly 300 to inhibit the downward motion of touchpad 342 in response to receipt of a control signal from the controller. For instance, inhibiting element 360 may be configured to extend from an interior surface of structure 355 into a cavity defined beneath touchpad 342. Examples of an inhibiting element 360 include but are not limited to a rotatable flange, a switching flange, and a piezoelectric element.

Locking assembly 350 can be configured to automatically revert back to the non-actuated state shown in FIG. 3A after a predetermined amount of time when a force exceeding the force threshold is received. Locking assembly 350 can be actuated by rotating inhibiting element 360, extending element 360 from within the body of locking assembly 350, or electrically stimulating a piezoelectric element to cause the piezoelectric element to extend toward the interior of selective inhibiting touchpad assembly 300. Locking assembly 350 can also be actuated using a shape-memory alloy (a.k.a. muscle wire) to selectively inhibit the downward motion of touchpad 342. A shape-memory alloy is an alloy that is capable of changing from a first shape to a second shape in response to a stimulus and then changing from the second shape to the first shape in response to removal of the stimulus. For example, when electrically stimulated or heated, the shape-memory alloy can extend toward the interior of selective inhibiting touchpad assembly 300 to inhibit the downward motion of touchpad 342. When not stimulated or heated, the shape-memory alloy can revert back to its original shape and retract from the interior of selective inhibiting touchpad assembly 300 such that it will not inhibit the downward motion of touchpad 342.

Locking assembly 350 can also be actuated using electromagnetic element(s) to selectively inhibit the downward motion of touchpad 342. For example, when the electromagnetic element(s) are stimulated with an electromagnetic field, the electromagnetic element(s) can be pushed or pulled by magnetic forces (depending on the polarity of the electromagnetic field). In one example embodiment, stimulation of the electromagnetic element(s) with the electromagnetic field causes the electromagnetic element(s) to be pushed or pulled from a non-inhibiting position to an inhibiting position to selectively inhibit the downward motion of touchpad 342 (e.g., by blocking a downward path of touchpad 342). In another example embodiment, stimulation of the electromagnetic element(s) with the electromagnetic field causes the electromagnetic element(s) to press against inhibiting element(s) (e.g., inhibiting element 360), which causes the inhibiting element(s) to extend toward the interior of selective inhibiting touchpad assembly 300. Accordingly, locking assembly 350 may include the electromagnetic element(s) in addition to inhibiting element(s), in lieu of inhibiting element(s), or in inhibiting element(s).

As shown in FIG. 3C, the locking assembly 350 being in the non-actuated state enables touchpad 342 to depress at least a top portion 330 of switch(es) 310 in response to a clicking input received at touch surface 315. For instance, touchpad 342 may depress top portion 330 of switch(es) 310 by rotating about hinge 335.

FIGS. 4A and 4B are front views of an example selective inhibiting touchpad assembly 400, which is another example implementation of a selective inhibiting touchpad assembly 100 shown in FIG. 1, in accordance with some embodiments of the present disclosure. FIGS. 4A and 4B will be discussed concurrently below. As shown in FIGS. 4A and 4B, selective inhibiting touchpad assembly 400 includes a plurality of switches 410, a touchpad 442, and a plurality of locking assemblies 450a-450c. FIG. 4A shows locking assemblies 450a-450c in a non-actuated state. FIG. 4B shows locking assemblies 450a-450c in an actuated state. Locking assemblies 450a-450c are configured to actuate toward the interior of selective inhibiting touchpad assembly 400. For instance, when actuated by a controller, locking assemblies 450a and 450c may extend respective inhibiting elements 460a and 460c toward the interior of selective inhibiting touchpad assembly 400. Locking assembly 450b can be disposed at a location similar to locking assembly 350 shown in FIG. 3C. When locking assembly 450b is actuated, locking assembly 350b may extend an inhibiting element (blocked from view) in a direction 405, which is pointing into the page. In this way, touchpad 442 is inhibited at three different locations and may be unable to move toward the mechanically-activated switches 410. Locking assemblies 450a-450c can be positioned at various locations along the perimeter of touchpad 442, though the scope of the example embodiments is not limited in this respect.

Selective inhibiting touchpad assembly 400 is described as having multiple locking assemblies for non-limiting, illustrative purposes. It will be recognized that selective inhibiting touchpad assembly 400 may include a single locking assembly.

FIGS. 4C and 4D are front views of an example selective inhibiting touchpad assembly 490, which is another example implementation of a selective inhibiting touchpad assembly 100 shown in FIG. 1, in accordance with some embodiments of the present disclosure. FIGS. 4C and 4D will be discussed concurrently below. As shown in FIGS. 4C and 4D, selective inhibiting touchpad assembly 490 includes a plurality of switches 410, a touchpad 442, and a plurality of locking assemblies 450b and 452a-452b. FIG. 4C shows locking assemblies 450b and 452a-452b in a non-actuated state. FIG. 4D shows locking assemblies 450b and 452a-452b in an actuated state. As shown in FIG. 4D, locking assemblies 452a-452b are disposed within an interior portion 445 of selective inhibiting touchpad assembly 490. Once a controller detects satisfaction of one or more inhibiting criteria, the controller can actuate locking assemblies 452a-452b to upwardly (i.e., toward bottom surface 425 of touchpad 442) extend respective inhibiting elements 454a-454b.

Any one or more of locking elements 450b and 454a-454b can directly engage bottom surface 425 of touchpad 442 or can come substantially close to bottom surface 425. In this way, inhibiting elements 450b and 454a-454b can inhibit touchpad 442 from moving toward switches 410. For example, when a scrolling input and a clicking input having a force above the force threshold are detected at touchpad 442, the controller can send a control signal to actuate locking assemblies 450b and 454a-454b. In another example, when three or more simultaneous pressure points (e.g., an input using 3 fingers) are detected at touch surface 415, the controller can send a control signal to actuate locking assemblies 450b and 454a-454b.

FIG. 5 is a side view of an example selective inhibiting touchpad assembly 500, which is another example implementation of a selective inhibiting touchpad assembly 100 shown in FIG. 1, in accordance with some embodiments of the present disclosure. As shown in FIG. 5, selective inhibiting touchpad assembly 500 includes a touchpad 542 and a scissor mechanism 575. Scissor mechanism 575 is configured to fold and unfold at pivoting point 515 such that touchpad 542 can be translated up and down along an axis 520.

Scissor mechanism 575 includes first and second linkages 565 and 570, which can be pivotably coupled to each other at pivoting point 515. First linkage 565 has first and second end portions 535a-535b at opposing ends of first linkage 565. Second linkage 570 has first and second end portions 540a-540b at opposing ends of second linkage 570. When scissor mechanism 575 is being folded or unfolded, one or more of end portions 535a, 535b, 540a, and 540b can slide in a lateral direction (e.g., in direction 545a or 545b). In this way, touchpad 542 can move up and down along axis 520. End portions 535a and 540b can be mounted to surface 560 of selective inhibiting touchpad assembly 500 such that end portions 535a and 540b can move only in the lateral direction along (e.g., with reference to) surface 560. Similarly, end portions 535b and 540a can be mounted to bottom surface 525 of touchpad 542 such that end portions 535b and 540a can move only in the lateral direction along bottom surface 525. For instance, end portions 535b and 540a can laterally move inward or outward in opposing lateral directions but do not move along axis 520 without touchpad 542 also moving along axis 520.

In an example embodiment, scissor mechanism 575 includes a pre-loaded spring 550 configured to push touchpad 542 against ledge 555. In this way, touchpad 542 can revert to its normal position after touchpad 542 is depressed by the user. The spring constant k of spring 550 can be selected such that a downward force in a range between 140 gf and 190 gf is required to activate switch 575.

FIGS. 6A and 6B are side views of an example selective inhibiting touchpad assembly 600, which is an example implementation of a selective inhibiting touchpad assembly 500 shown in FIG. 5, including a locking assembly to lock a touchpad in accordance with some embodiments of the present disclosure. FIGS. 6A and 6B will be discussed concurrently below. As shown in FIG. 6A, selective inhibiting touchpad assembly 600 includes mechanically-activated switch(es) 510, a touchpad 542, scissor mechanism 575, and locking assemblies 650 and 680. As shown in FIG. 6B, locking assembly 650 is configured to actuate inhibiting element 660 when a control signal is received to inhibit (e.g., block) the downward motion of touchpad 542. Locking assembly 650 is shown to be coupled to a structure 655 near a front edge of a computing device that includes selective inhibiting touchpad assembly 600 for non-limiting, illustrative purposes. Locking assembly 680 is configured to actuate an inhibiting element (hidden from view) to inhibit the downward motion of touchpad 542. Locking assembly 680 may be disposed on a structure near a side edge of the computing device. Each of locking assemblies 650 and 680 can be an actuatable flange, a rotatable member, a piezoelectric element, a piezoelectric surface, or other suitable type of locking assembly.

FIGS. 7A and 7B are side views of an example selective inhibiting touchpad assembly 700, which is another example implementation of a selective inhibiting touchpad assembly 500 shown in FIG. 5, including a locking assembly to lock a scissor mechanism in accordance with some embodiments of the present disclosure. FIGS. 7A and 7B will be discussed concurrently below. As shown in FIG. 7A, selective inhibiting touchpad assembly 700 includes a touchpad 542, scissor mechanism 575, and locking assemblies 750*a*-750*b*. Locking assemblies 750*a*-750*b* can be disposed on structures of the computing device adjacent to selective inhibiting touchpad assembly 700. Locking assemblies 750*a*-750*b* can be configured to inhibit scissor mechanism 575 from folding by blocking respective end portions 540*b* and/or 535*a*. As shown in FIG. 7B, locking assembly 750*a* is configured to actuate inhibiting element 760*a* in response to receipt of a control signal from a controller (e.g., controller 134) to block end portion 540*b* from moving laterally along surface 560. Similarly, locking assembly 750*b* is configured to actuate inhibiting element 760*b* in response to receipt of a control signal from the controller to block end portion 535*a* from moving laterally along surface 560. In this way, scissor mechanism 575 is locked in place and cannot be folded. Consequently, the downward motion of touchpad 542 is substantially limited.

FIGS. 8A and 8B are cutout views of an example selective inhibiting touchpad assembly 800, which is another example implementation of a selective inhibiting touchpad assembly 100 shown in FIG. 1, in accordance with some embodiments of the present disclosure. As shown in FIGS. 8A and 8B, selective inhibiting touchpad assembly 800 includes a mechanically-activated switch 810, a touchpad 842, and a piezoelectric structure 885. Piezoelectric structure 885 partially or fully encircles mechanically-activated switch 810. Piezoelectric structure 885 is configured to actuate (e.g., flex or rise) when a current is applied to piezoelectric structure 885. FIG. 8A shows piezoelectric structure 885 in a non-actuated state, which allows touchpad 842 to move downward and depress mechanically-activated switch 810. FIG. 8B shows piezoelectric structure 885 in an actuated state. In the actuated state, inner portion 815 of piezoelectric structure 885 extends toward touchpad 842 to engage bottom surface 825 of touchpad 842. By engaging bottom surface 825, inner portion 815 inhibits the downward travel path of touchpad 842.

FIG. 8C is a top view of piezoelectric structure 885 and switch 210 shown in FIGS. 8A and 8B in accordance with some embodiments of the present disclosure. In the embodiment of FIG. 8C, piezoelectric structure 885 is shown to completely encircle switch 810 for non-limiting, illustrative purposes. It will be recognized that piezoelectric structure 885 need not necessarily completely encircle switch 810. For instance, piezoelectric structure 885 can partially encircle switch 810.

FIGS. 9 and 10 depict flowcharts 900 and 1000 of example methods for limiting inadvertent actuations of a touchpad in accordance with some embodiments of the present disclosure. Flowcharts 900 and 1000 may be performed by computing device 100 shown in FIG. 1, for example. Further structural and operational embodiments will be apparent to persons skilled in the relevant art(s) based on the discussion regarding flowcharts 900 and 1000.

As shown in FIG. 9, the method flowchart 900 starts at 910 where a touch input is received from a user at the touchpad. For example, touchpad 142 (e.g., a touch surface thereof) may receive the touch input from the user.

At 920, a sensor (e.g., capacitive sensor, resistive sensor, piezoelectric force sensor, etc.) is used to determine an input mode of the touch input and the depression force associated with the touch input. Examples of an input mode include but are not limited to a light touch mode, a clicking input mode, a mousing input mode, a scrolling input mode, a multi-point (e.g., multi-finger) input mode, a long-duration pressure input mode, or any combination thereof. For example, an input mode of a touch input can comprise a scrolling input accompanied with a scooping motion, which creates a clicking input if the scooping motion generates a depression force exceeding a force threshold. In another example, an input mode of a touch input can comprise a three-finger input accompanied with a click. The sensor may include a single sensor or multiple sensors.

At 930, a locking assembly is used to selectively inhibit the touchpad from depressing a switch (e.g., a mechanically-activated switch) based at least in part on the input mode and on the sensed depression force. For instance, the locking assembly may be used to selectively inhibit the touchpad from depressing the switch based at least in part on the input mode and further based at least in part on whether the depression force exceeds a force threshold. For example, controller 134 can send a control signal 146 to locking assembly 136 to cause locking assembly 136 to inhibit touchpad 142 from depressing mechanically-activated switch(es) 138 (e.g., and consequently inhibiting touchpad 142 from causing mechanically-activated switch(es) 138 to produce an audible and/or haptic click) when one or more inhibiting criteria are met. Examples of an inhibiting criterion include but are not limited to (a) the input mode comprising a scrolling input and the depression force exceeding the force threshold; (b) the input mode comprising a long-duration pressure input over a surface area greater than a surface area threshold (e.g., caused by a palm resting on the touchpad); (c) the input mode comprising three or more distinct pressure locations on a touch surface of the touchpad; and (d) the controller inferring that the user does not intend to use the touchpad or that the user does not intend to perform a clicking input on the touchpad.

As shown in FIG. 10, the method flowchart 1000 starts at 1010 where an input from a user is received at a user interface of computing device 100. A user interface of computing device 100 can be a keyboard, a mouse, a touchpad, or a touchscreen. The input can be a keyboard input, a mouse input (e.g., a mouse movement, a mouse click, a mouse scroll), a touchscreen input, or a touchpad input. The touchscreen input can have several modes of input such as, but not limited to, a light touch input mode, a screen tap input mode, a screen double-tap input mode, a hovering input mode, and a mousing input mode. Similarly, the touchpad input can have several modes of input such as, but not limited to, a light touch input mode, a tap input mode, a double-tap input mode, a clicking input mode, a hovering input mode, a scrolling input mode, and a mousing input mode.

At 1020, the intent of the user can be inferred based on the source of the input (e.g., keyboard input, touchscreen input) and/or the mode of input (e.g., a mousing input, a hovering input). A source of the received input can be from a keyboard, a mouse, a touchscreen, or a touchpad. Each source of input can be further classified into one or more input modes. For example, as previously explained, a touchpad input can be further classified into a plurality of input modes such as, but not limited to, a light touch input mode, a clicking input mode, a mousing input mode, a multi-point input mode (e.g., a scrolling input mode), or a long-duration pressure input mode. At 1020, a controller (e.g., controller 134, processor 140) is configured to infer the intent of the user based on the source of the input and/or the mode of the input. For example, controller 134 can infer the intent of the user when the only source of inputs is from a keyboard. For instance, controller 134 can infer that the intent of the user is to actively type in the inputs using the keyboard and that any clicking input using the touchpad during the active typing activity is not intended when the keyboard is in active use.

In another example, controller 134 can infer that the user wants to interact with computing device 100 using only the touchscreen and not the touchpad when inputs are being received from the touchscreen. For instance, the user may provide a mousing input via the touchscreen. During the active mousing activities on the touchscreen, the controller can infer that any clicking input on the touchpad is unwanted or that the user wants to interact with computing device 100 using only the touchscreen.

In yet another example, controller 134 can infer that the user does not intend to perform any clicking input using the touchpad when a mousing input from the mouse is received. Other examples where controller 134 can infer that the user does not intend to perform a clicking input using the touchpad include: (a) a scrolling input using a touchpad; (b) a long-duration pressure input over a surface area greater than a surface area threshold (e.g., caused by a palm resting on the touchpad); or (c) pressure inputs from three or more distinct locations on a touch surface of the touchpad. In each of these examples, controller 134 can infer that the user does not intend to perform a clicking input using the touchpad. It should be recognized that the above described examples are not exhaustive.

At 1030, a locking assembly is used to selectively inhibit the touchpad from depressing a mechanically-activated switch based at least in part on the inferred intent of the user. In one embodiment, the locking assembly is configured to selectively inhibit the touchpad from depressing the mechanically-activated switched when the inferred intent of the user is not to perform a clicking input using the touchpad. Stated differently, the locking assembly is configured to selectively inhibit the touchpad from depressing the mechanically-activated switched when the inferred intent of the user is to use the keyboard, the mouse, and/or the touchscreen exclusively as input devices. For example, the locking assembly can inhibit the touchpad from depressing the mechanically-activated switch when the source of the received input is from the keyboard, the touchscreen, or the mouse of the computing device as this can mean that the user intent is to only use one of those devices to provide inputs to the computing device. For instance, when the keyboard is used as an input device, it is highly likely that the user does not intend to perform any clicking input on the touchpad. Thus, controller 134 can lock touchpad 142 to prevent any clicking input to occur. Similarly, when computing device 100 receives inputs from a touchscreen, locking assembly 136 can be actuated to inhibit touchpad 142 from depressing mechanically-activated switch(es) 138 as any clicking input at the touchpad is most likely unintentional.

Controller 134 can also infer that the user does not intend to perform a clicking input on touchpad 142 by detecting a hovering input over the touchpad. For example, the user may provide a hovering input by moving a finger just above touchpad 142. Based on this hovering input, controller 134 can actuate locking assembly 136 to inhibit touchpad 142 from actuating. In one embodiment, controller 134 can additionally determine the pattern traced out by the hovering input or the direction in which the hovering input originated to determine the user intent. For example, if the direction in which the hovering input originated started from the upper edge, left edge, or right edge of touchpad 142, then controller 142 can infer that the user does not intend to perform a clicking input. In this example, controller 134 can actuate locking assembly 136 to inhibit touchpad 142 from depressing mechanically-activated switch(es) 138. If the direction in which the hovering input originated from the bottom edge of touchpad 142, then controller 142 can infer that the user may subsequently intend to perform a clicking input using touchpad 142. In this case, locking assembly 136 will not be actuated.

Controller 134 can also infer that the user does not intend to perform a clicking input on touchpad 142 by determining the orientation of the user finger(s) and/or hand. This can be done by analyzing a surface area of a capacitive sensor of touchpad 142 that experiences a capacitive change that exceeds a designated threshold, which is caused by the user finger(s) and/or hand hovering over touchpad 142. For instance, if the affected surface area has a shape that approximates a finger or a thumb lying sideways or in a crescent shape, then controller 134 can infer that the user does not intend to perform a clicking function. Accordingly, controller 134 can actuate locking assembly 136 to inhibit touchpad 142 from actuating.

Controller 134 can also infer that the user does not intend to perform a clicking input on touchpad 142 by analyzing the touch or landing pattern generated by a touch input at touchpad 142. For example, if landing pattern has an area equal to or greater than the average size of three fingertips, controller 134 can infer that the user does not intend to perform a clicking function using touchpad 142. In another example, if the landing pattern has a shape that is not substantially a circle or an oval (which is typically the pattern generated by a fingertip), controller 134 can infer that the user does not intend to perform a clicking function using touchpad 142. In other words, if the landing pattern has an irregular shape such as a crescent (which is typically generated by a portion of the palm), a L-shaped pattern, or a rectangle, then controller 134 can infer that the user does not intend to perform a clicking function using touchpad 142.

FIG. 11 depict flowchart 1100 of an example method for limiting inadvertent actuations of a touchpad in accordance with some embodiments of the present disclosure. Flowchart 1100 may be performed by computing device 100 shown in FIG. 1, for example. Further structural and operational embodiments will be apparent to persons skilled in the relevant art(s) based on the discussion regarding flowcharts 1100.

The method flowchart 1100 starts at 1110 where one or more inputs are received at one or more user interfaces of a computing device from a user. In an example implementation, user interface(s) of computing device 100 receive the one or more inputs. The one or more inputs can be received in response to user activities at computing device 100. Examples of a user input include but are not limited to a touchscreen input, a keyboard input, a mouse input, a touchpad input, a camera input, a processor input, and an operating system input.

At 1120, the touchpad is selectively inhibited from depressing one or more mechanically-activated switches, using a locking assembly, based at least in part on the one or more inputs from the user. In an example implementation, locking assembly 136 is used to selectively inhibit touchpad 142 from depressing mechanically-activated switch(es) 138 based at least in part on the one or more inputs from the user. For instance, controller 130 may use (e.g., control) locking assembly 136 to selectively inhibit touchpad 142 from depressing mechanically-activated switch(es) 138.

In an example implementation, selectively inhibiting the touchpad from depressing the one or more mechanically-activated switches at step 1120 includes selectively increasing a force threshold associated with the touchpad to an increased force threshold to inhibit the touchpad from depressing the one or more mechanically-activated switches. In accordance with this implementation, the force threshold indicates an amount of force associated with an input received at the touchpad that is required to cause the touchpad to depress the one or more mechanically-activated switches. In further accordance with this implementation, selectively inhibiting the touchpad from depressing the one or more mechanically-activated switches at step 1120 further includes allowing the touchpad to depress the one or more mechanically-activated switches based at least in part on a force of an input that is received at the touchpad exceeding the increased force threshold.

For instance, the locking assembly may include a shape-memory alloy or a piezoelectric element that is configured to extend (e.g., expand) in response to a stimulus. Selectively increasing the force threshold to the increased force threshold may include selectively stimulating the shape-memory alloy or the piezoelectric element, which may cause the shape-memory alloy or the piezoelectric element to extend against an edge of the touchpad and/or into a travel-path of the touchpad. Although extension of the shape-memory alloy or the piezoelectric element in response to the stimulus may result in the force threshold associated with the touchpad being increased to the increased force threshold, the shape-memory alloy or the piezoelectric element may allow the touchpad to depress the one or more mechanically-activated switches so long as the force of the input that is received at the touchpad is greater than the increased force threshold.

In another example implementation, selectively inhibiting the touchpad from depressing the one or more mechanically-activated switches at step 1120 includes selectively inhibiting the touchpad from depressing one or more mechanically-activated switches that are disposed adjacent to a first end of the touchpad by inhibiting the touchpad from pivoting about a pivot point of a hinge that is coupled to a second end of the touchpad that is opposite the first end of the touchpad based at least in part on the one or more inputs from the user.

In yet another example implementation, selectively inhibiting the touchpad from depressing the one or more mechanically-activated switches at step 1120 includes selectively inhibiting the touchpad from depressing one or more mechanically-activated switches that are disposed adjacent to the touchpad by inhibiting a scissor mechanism that is supporting the touch pad from folding about a pivot point based at least in part on the one or more inputs from the user. In accordance with this implementation, the scissor mechanism is coupled to a structure of the computing device and to the touchpad. In further accordance with this implementation, the scissor mechanism comprises first and second linkages configured to be foldable at the pivoting point.

III. Example Computer System

FIG. 12 depicts an example computer 1200 in which embodiments may be implemented. For instance, computing device 120 shown in FIG. 1 may be implemented using computer 1200, including one or more features of computer 1200 and/or alternative features. Computer 1200 may be a general-purpose computing device in the form of a conventional personal computer, a mobile computer, or a workstation, for example, or computer 1200 may be a special purpose computing device. The description of computer 1200 provided herein is provided for purposes of illustration, and is not intended to be limiting. Embodiments may be implemented in further types of computer systems, as would be known to persons skilled in the relevant art(s).

As shown in FIG. 12, computer 1200 includes a processing unit 1202, a system memory 1204, and a bus 1206 that couples various system components including system memory 1204 to processing unit 1202. Bus 1206 represents one or more of any of several types of bus structures, including a memory bus or memory controller, a peripheral bus, an accelerated graphics port, and a processor or local bus using any of a variety of bus architectures. System memory 1204 includes read only memory (ROM) 1208 and random access memory (RAM) 1210. A basic input/output system 1212 (BIOS) is stored in ROM 1208.

Computer 1200 also has one or more of the following drives: a hard disk drive 1214 for reading from and writing to a hard disk, a magnetic disk drive 1216 for reading from or writing to a removable magnetic disk 1218, and an optical disk drive 1220 for reading from or writing to a removable optical disk 1222 such as a CD ROM, DVD ROM, or other optical media. Hard disk drive 1214, magnetic disk drive 1216, and optical disk drive 1220 are connected to bus 1206 by a hard disk drive interface 1224, a magnetic disk drive interface 1226, and an optical drive interface 1228, respectively. The drives and their associated computer-readable storage media provide nonvolatile storage of computer-readable instructions, data structures, program modules and other data for the computer. Although a hard disk, a removable magnetic disk and a removable optical disk are described, other types of computer-readable storage media can be used to store data, such as flash memory cards, digital video disks, random access memories (RAMs), read only memories (ROM), and the like.

A number of program modules may be stored on the hard disk, magnetic disk, optical disk, ROM, or RAM. These programs include an operating system 1230, one or more application programs 1232, other program modules 1234, and program data 1236. Application programs 1232 or program modules 1234 may include, for example, computer program logic for implementing controller 134 and/or flowcharts 900, 1000, 1100 (including any step of flowcharts 900, 1000, 1100), as described herein.

A user may enter commands and information into the computer 1200 through input devices such as keyboard 1238 and pointing device 1240 (e.g., a touchpad). Other input devices (not shown) may include a microphone, joystick, game pad, satellite dish, scanner, touch screen, camera, accelerometer, gyroscope, or the like. These and other input devices are often connected to the processing unit 1202 through a serial port interface 1242 that is coupled to bus 1206, but may be connected by other interfaces, such as a parallel port, game port, or a universal serial bus (USB).

A display device 1244 (e.g., a monitor) is also connected to bus 1206 via an interface, such as a video adapter 1246. In addition to display device 1244, computer 1200 may include other peripheral output devices (not shown) such as speakers and printers.

Computer 1200 is connected to a network 1248 (e.g., the Internet) through a network interface or adapter 1250, a modem 1252, or other means for establishing communications over the network. Modem 1252, which may be internal or external, is connected to bus 1206 via serial port interface 1242.

As used herein, the terms "computer program medium" and "computer-readable storage medium" are used to generally refer to media (e.g., non-transitory media) such as the hard disk associated with hard disk drive 1214, removable magnetic disk 1218, removable optical disk 1222, as well as other media such as flash memory cards, digital video disks, random access memories (RAMs), read only memories (ROM), and the like. Such computer-readable storage media are distinguished from and non-overlapping with communication media (do not include communication media). Communication media embodies computer-readable instructions, data structures, program modules or other data in a modulated data signal such as a carrier wave. The term "modulated data signal" means a signal that has one or more of its characteristics set or changed in such a manner as to encode information in the signal. By way of example, and not limitation, communication media includes wireless media such as acoustic, RF, infrared and other wireless media, as well as wired media. Example embodiments are also directed to such communication media.

As noted above, computer programs and modules (including application programs 1232 and other program modules 1234) may be stored on the hard disk, magnetic disk, optical disk, ROM, or RAM. Such computer programs may also be received via network interface 1250 or serial port interface 1242. Such computer programs, when executed or loaded by an application, enable computer 1200 to implement features of embodiments discussed herein. Accordingly, such computer programs represent controllers of the computer 1200.

Example embodiments are also directed to computer program products comprising software (e.g., computer-readable instructions) stored on any computer-useable medium. Such software, when executed in one or more data processing devices, causes data processing device(s) to operate as described herein. Embodiments may employ any computer-useable or computer-readable medium, known now or in the future. Examples of computer-readable mediums include, but are not limited to storage devices such as RAM, hard drives, floppy disks, CD ROMs, DVD ROMs, zip disks, tapes, magnetic storage devices, optical storage devices, MEMS-based storage devices, nanotechnology-based storage devices, and the like.

It will be recognized that the disclosed technologies are not limited to any particular computer or type of hardware. Certain details of suitable computers and hardware are well known and need not be set forth in detail in this disclosure.

IV. Further Discussion of Some Example Embodiments

A first example computing device includes a plurality of input devices, mechanically-activated switch(es), a hinge, a locking assembly, and a controller. The plurality of input devices are configured to receive one or more inputs from a user. The plurality of input devices comprise a touchpad having a touch surface that is configured to receive a touch input from the user. The mechanically-activated switch(es) are disposed adjacent to a first end of the touchpad. The mechanically-activated switch(es) are configured to be activated based at least in part on the touch input causing the touchpad to depress the mechanically-activated switch(es). The hinge is coupled to a second end of the touchpad that is opposite the first end of the touchpad that is configured to pivot about the hinge. The locking assembly is configured to selectively mechanically inhibit the activation of the mechanically-activated switch(es) by inhibiting the touchpad from pivoting about the hinge based at least in part on a control signal. The controller is configured to cause the locking assembly to mechanically inhibit the activation of the mechanically-activated switch(es) by providing the control signal to the locking assembly based at least in part on the one or more inputs of the plurality of input devices.

In a first aspect of the first example computing device, the controller is configured to cause the locking assembly to mechanically inhibit the activation of the one or more mechanically-activated switches by providing the control signal to the locking assembly based at least in part on at least one of a processor input or an operating system input triggered by at least one of the one or more inputs from the user.

In a second aspect of the first example computing device, the locking assembly comprises one or more latches configured to inhibit the touchpad from traveling toward the one or more mechanically-activated switches by physically blocking a travel-path of the touchpad based at least in part on receipt of the control signal from the controller. The second aspect of the first example computing device may be implemented in combination with the first aspect of the first example computing device, though the example embodiments are not limited in this respect.

In a first implementation of the second aspect of the first example computing device, the locking assembly is configured to cause the one or more latches to physically block the travel-path of the first end of the touchpad by extending one or more portions of the one or more latches along an axis that is substantially parallel to the touch surface such that the one or more portions block the travel-path of the touchpad.

In a second implementation of the second aspect of the first example computing device, the locking assembly is configured to cause the one or more latches to physically block the travel-path of the first end of the touchpad by extending one or more portions of the one or more latches along an axis that is substantially perpendicular to the touch surface such that the one or more portions block the travel-path of the touchpad.

In a third implementation of the second aspect of the first example computing device, wherein the one or more latches comprise at least one shape-memory alloy configured to at least one of (a) extend into the travel-path of the touchpad or (b) extend such that the shape-memory alloy pushes at least one inhibiting element into the travel-path of the touchpad, based at least in part on receipt of the control signal from the controller.

In a third aspect of the first example computing device, the locking assembly comprises one or more actuatable elements that at least partially encircle the one or more mechanically-activated switches. The one or more actuatable elements are configured to inhibit the touchpad from traveling toward the one or more mechanically-activated switches by physically engaging a surface of the touchpad that is opposite the touch surface of the touchpad based at least in part on receipt of the control signal from the controller. The third aspect of the first example computing device may be implemented in combination with the first and/or second aspect of the first example computing device, though the example embodiments are not limited in this respect.

In an implementation of the third aspect of the first example computing device, each of the one or more actuatable elements comprises a piezoelectric element.

In a fourth aspect of the first example computing device, the controller is configured to cause the locking assembly to mechanically inhibit the activation of the one or more mechanically-activated switches based at least in part on: (a) detection, at the touchpad, of a scrolling input having a depression force that is greater than or equal to a depression force threshold, (b) detection, at the touchpad, of a long-duration pressure input having a force that is greater than or equal to the depression force threshold, (c) detection of a long-duration pressure input over a surface area that is greater than a surface area threshold, or (d) detection of three or more simultaneous pressure points on the touch surface. The fourth aspect of the first example computing device may be implemented in combination with the first, second, and/or third aspect of the first example computing device, though the example embodiments are not limited in this respect.

A second example computing device includes a plurality of input devices, mechanically-activated switch(es), a scissor mechanism, a locking assembly, and a controller. The plurality of input devices are configured to receive one or more inputs from a user. The plurality of input devices comprise a touchpad that is configured to receive a touch input from the user. The mechanically-activated switch(es) are positioned adjacent to the touchpad. The mechanically-activated switch(es) are configured to be activated based at least in part on the touch input causing the touchpad to depress the mechanically-activated switch(es). The scissor mechanism is coupled to a structure of the computing device and to the touchpad. The scissor mechanism comprises first and second linkages configured to be foldable at a pivoting point. The locking assembly configured to selectively inhibit the touchpad from depressing the one or more mechanically-activated switches by inhibiting the scissor mechanism from folding depending on whether the locking assembly is actuated. The controller is configured to selectively actuate the locking assembly to inhibit the touchpad from depressing the one or more mechanically-activated switches based at least in part on the one or more inputs from the user.

In a first aspect of the second example computing device, the controller is configured to cause the locking assembly to mechanically inhibit the activation of the one or more mechanically-activated switches by providing the control signal to the locking assembly based at least in part on at least one of a processor input or an operating system input triggered by at least one of the one or more inputs from the user In a second aspect of the second example computing device, the second example computing device further comprises a sensor coupled to the touchpad. The sensor is configured to determine an input mode of the touch input and further configured to detect a depression force of the touch input. In accordance with the second aspect, the controller is configured to selectively actuate the locking assembly to inhibit the touchpad based at least in part on (a) the one or more inputs not being received by the touchpad, (b) the depression force of the touch input exceeding a depression force threshold and the input mode comprising a scrolling input, (b) the input mode comprising a long-duration pressure input over a surface area that is greater than a surface area threshold, or (c) the input mode comprising three or more distinct pressure locations on a surface of the touchpad. The second aspect of the second example computing device may be implemented in combination with the first aspect of the second example computing device, though the example embodiments are not limited in this respect.

In a third aspect of the second example computing device, the scissor mechanism is configured to support the touchpad over the one or more mechanically-activated switches. The scissor mechanism is further configured to translate the touchpad based at least in part on the first and second linkages being folded at the pivoting point. The third aspect of the second example computing device may be implemented in combination with the first and/or second aspect of the second example computing device, though the example embodiments are not limited in this respect.

In a fourth aspect of the second example computing device, the locking assembly comprises one or more latches configured to selectively inhibit the touchpad from depressing the one or more mechanically-activated switches by pressing against the scissor mechanism to inhibit the scissor mechanism from folding depending on whether the locking assembly is actuated. The fourth aspect of the second example computing device may be implemented in combination with the first, second, and/or third aspect of the second example computing device, though the example embodiments are not limited in this respect.

In a fifth aspect of the second example computing device, the locking assembly comprises one or more latches configured to selectively inhibit the touchpad from depressing the one or more mechanically-activated switches, by pressing against the touchpad to physically block a travel-path of the touchpad, depending on whether the locking assembly is actuated. The fifth aspect of the second example computing device may be implemented in combination with the first, second, third aspect, and/or fourth aspect of the second example computing device, though the example embodiments are not limited in this respect.

In an implementation of the fifth aspect of the second example computing device, the locking assembly comprises at least one shape-memory alloy configured to at least one of (a) extend into a travel-path of the touchpad or (b) extend such that the shape-memory alloy pushes at least one inhibiting element into the travel-path of the touchpad, based at least in part on the locking assembly being actuated.

In a sixth aspect of the second example computing device, the locking assembly comprises one or more actuatable elements at least partially encircling the one or more mechanically-activated switches. In accordance with the sixth aspect, the one or more actuatable elements are configured to selectively inhibit the touchpad from depressing the one or more mechanically-activated switches, by physically engaging a surface of the touchpad that is opposite a touch surface of the touchpad, depending on whether the locking assembly is actuated. In further accordance with the sixth aspect, the touch surface is configured to receive the touch input. The sixth aspect of the second example computing device may be implemented in combination with the first, second, third aspect, fourth, and/or fifth aspect of the second example computing device, though the example embodiments are not limited in this respect.

In a first implementation of the sixth aspect of the second example computing device, each of the one or more actuatable elements comprises a surface having an opening that encircles one of the one or more mechanically-activated switches.

In a second implementation of the sixth aspect of the second example computing device, each of the one or more actuatable elements comprises a piezoelectric element.

In a first example method for limiting inadvertent actuations of a touchpad, one or more inputs from a user are received at one or more user interfaces of a computing device. The touchpad is selectively inhibited from depressing one or more mechanically-activated switches that are disposed adjacent to a first end of the touchpad by inhibiting the touchpad from pivoting about a pivot point of a hinge that is coupled to a second end of the touchpad that is opposite the first end of the touchpad based at least in part on the one or more inputs from the user.

In an aspect of the first example method, selectively inhibiting the touchpad from depressing the one or more mechanically-activated switches comprises selectively increasing a force threshold associated with the touchpad to an increased force threshold to inhibit the touchpad from depressing the one or more mechanically-activated switches. In accordance with this aspect, the force threshold indicates an amount of force associated with an input received at the touchpad that is required to cause the touchpad to depress the one or more mechanically-activated switches. In further accordance with this aspect, selectively inhibiting the touchpad from depressing the one or more mechanically-activated switches further comprises allowing the touchpad to depress the one or more mechanically-activated switches based at least in part on a force of an input that is received at the touchpad exceeding the increased force threshold.

In a second example method for limiting inadvertent actuations of a touchpad, one or more inputs from a user are received at one or more user interfaces of a computing device. The touchpad is selectively inhibited from depressing one or more mechanically-activated switches that are disposed adjacent to the touchpad by inhibiting a scissor mechanism that is supporting the touch pad from folding about a pivot point based at least in part on the one or more inputs from the user. The scissor mechanism is coupled to a structure of the computing device and to the touchpad. The scissor mechanism comprises first and second linkages configured to be foldable at the pivoting point.

In an aspect of the second example method, selectively inhibiting the touchpad from depressing the one or more mechanically-activated switches comprises selectively increasing a force threshold associated with the touchpad to an increased force threshold to inhibit the touchpad from depressing the one or more mechanically-activated switches. In accordance with this aspect, the force threshold indicates an amount of force associated with an input received at the touchpad that is required to cause the touchpad to depress the one or more mechanically-activated switches. In further accordance with this aspect, selectively inhibiting the touchpad from depressing the one or more mechanically-activated switches further comprises allowing the touchpad to depress the one or more mechanically-activated switches based at least in part on a force of an input that is received at the touchpad exceeding the increased force threshold.

V. Conclusion

Although the subject matter has been described in language specific to structural features and/or acts, it is to be understood that the subject matter defined in the appended claims is not necessarily limited to the specific features or acts described above. Rather, the specific features and acts described above are disclosed as examples of implementing the claims, and other equivalent features and acts are intended to be within the scope of the claims.

What is claimed is:

1. A computing device comprising:
a plurality of input devices configured to receive one or more inputs from a user, the plurality of input devices comprising a touchpad having a touch surface, the touch surface configured to receive a touch input from the user;
one or more mechanically-activated switches positioned adjacent to the touchpad, the one or more mechanically-activated switches configured to be activated based at least in part on the touch input causing the touchpad to depress the one or more mechanically-activated switches;
a scissor mechanism coupled to a structure of the computing device and to the touchpad, the scissor mechanism comprising first and second linkages configured to be foldable at a pivoting point;
a locking assembly configured to selectively inhibit the touchpad from depressing the one or more mechanically-activated switches by inhibiting the scissor mechanism from folding depending on whether the locking assembly is actuated;
a sensor coupled to the touchpad, the sensor configured to determine an input mode of the touch input and further configured to detect a depression force of the touch input; and
a controller configured to selectively actuate the locking assembly to inhibit the touchpad from depressing the one or more mechanically-activated switches based at least in part on (a) the one or more inputs not being received by the touchpad, (b) the depression force of the touch input exceeding a depression force threshold and the input mode comprising a scrolling input, (c) the input mode comprising a long-duration pressure input over a surface area that is greater than a surface area threshold, or (d) the input mode comprising three or more distinct pressure locations on a surface of the touchpad.

2. The computing device of claim 1, wherein the controller is configured to cause the locking assembly to mechanically inhibit the activation of the one or more mechanically-activated switches by providing a control signal to the locking assembly based at least in part on at least one of a processor input or an operating system input triggered by at least one of the one or more inputs from the user.

3. The computing device of claim 1, wherein the scissor mechanism is configured to support the touchpad over the one or more mechanically-activated switches; and
wherein the scissor mechanism is further configured to translate the touchpad based at least in part on the first and second linkages being folded at the pivoting point.

4. The computing device of claim 1, wherein the locking assembly comprises:
one or more latches configured to selectively inhibit the touchpad from depressing the one or more mechanically-activated switches, by pressing against the touchpad to physically block a travel-path of the touchpad, depending on whether the locking assembly is actuated.

5. The computing device of claim 4, wherein the locking assembly comprises:
at least one shape-memory alloy configured to at least one of (a) extend into a travel-path of the touchpad or (b) extend such that the shape-memory alloy pushes at least one inhibiting element into the travel-path of the touchpad, based at least in part on the locking assembly being actuated.

6. The computing device of claim 1, wherein the locking assembly comprises:
one or more actuatable elements at least partially encircling the one or more mechanically-activated switches; and
wherein the one or more actuatable elements are configured to selectively inhibit the touchpad from depressing the one or more mechanically-activated switches, by physically engaging a surface of the touchpad that is opposite the touch surface of the touchpad, depending on whether the locking assembly is actuated.

7. The computing device of claim 6, wherein each of the one or more actuatable elements comprises a surface having an opening that encircles one of the one or more mechanically-activated switches.

8. The computing device of claim 6, wherein each of the one or more actuatable elements comprises a piezoelectric element.

9. The computing device of claim 6, wherein each of the one or more actuatable elements comprises a rotatable member.

10. The computing device of claim 1, wherein the scissor mechanism further comprises a pre-loaded spring coupled to the pivoting point, the pre-loaded spring having a spring constant that enables the one or more mechanically-activated switches to be activated based on the touch input having a force in a range between 140 grams force and 190 grams force.

11. The computing device of claim 1, wherein the first end portion of the first linkage and the first end portion of the second linkage are mounted to a surface of the touchpad such that movement of the first end portion of the first linkage and movement of the first end portion of the second linkage are limited to a lateral direction along the surface of the touchpad; and
wherein the second end portion of the first linkage and the second end portion of the second linkage are mounted to a surface of the structure of the computing device such that movement of the second end portion of the first linkage and movement of the second end portion of the second linkage are limited to the lateral direction along the surface of the structure of the computing device.

12. The computing device of claim 1, wherein the controller is configured to cause the locking assembly to mechanically inhibit the activation of the one or more mechanically-activated switches by providing a control signal to the locking assembly based at least in part on at least one of a processor input or an operating system input triggered by at least one of the one or more inputs from the user.

13. A method comprising:
receiving, at a plurality of input devices comprising a touchpad that has a touch surface configured to receive a touch input from a user, one or more inputs from the user;
selectively inhibiting, by a locking assembly, the touchpad from depressing one or more mechanically-activated switches, which are positioned adjacent to the touchpad and which are configured to be activated based at least in part on the touch input causing the touchpad to depress the one or more mechanically-activated switches, by inhibiting a scissor mechanism, which is coupled to a structure of the computing device and to the touchpad and which comprises first and second linkages configured to be foldable at a pivoting point, from folding depending on whether the locking assembly is actuated; and
selectively actuating, by a controller, the locking assembly to inhibit the touchpad from depressing the one or more mechanically-activated switches based at least in part on the one or more inputs from the user, wherein selectively actuating comprises:
causing the locking assembly to mechanically inhibit the activation of the one or more mechanically-activated switches by providing a control signal to the locking assembly based at least in part on at least one of a processor input or an operating system input triggered by at least one of the one or more inputs from the user.

14. The method of claim 13, comprising:
determining, by a sensor that is coupled to the touchpad, an input mode of the touch input;
detecting, by the sensor, a depression force of the touch input; and
selectively actuating, by the controller, the locking assembly to inhibit the touchpad based at least in part on (a) the one or more inputs not being received by the touchpad, (b) the depression force of the touch input exceeding a depression force threshold and the input mode comprising a scrolling input, (c) the input mode comprising a long-duration pressure input over a surface area that is greater than a surface area threshold, or (d) the input mode comprising three or more distinct pressure locations on a surface of the touchpad.

15. The method of claim 13, further comprising:
supporting, by the scissor mechanism which is configured to translate the touchpad based at least in part on the first and second linkages being folded at the pivoting point, the touchpad over the one or more mechanically-activated switches.

16. The method of claim 13, wherein selectively inhibiting the touchpad from depressing the one or more mechanically-activated switches comprises:
selectively inhibiting, by one or more latches that are included in the locking assembly, the touchpad from depressing the one or more mechanically-activated switches, by pressing against the touchpad to physically block a travel-path of the touchpad, depending on whether the locking assembly is actuated.

17. The method of claim 16, wherein selectively inhibiting the touchpad from depressing the one or more mechanically-activated switches comprises:

at least one of (a) extending, by at least one shape-memory alloy that is included in the locking assembly, into a travel-path of the touchpad or (b) extending, by the at least one shape-memory alloy, such that the shape-memory alloy pushes at least one inhibiting element into the travel-path of the touchpad, based at least in part on the locking assembly being actuated.

18. The method of claim 13, wherein selectively inhibiting the touchpad from depressing the one or more mechanically-activated switches comprises:

selectively inhibiting, by one or more actuatable elements that are included in the locking assembly and that at least partially encircle the one or more mechanically-activated switches, the touchpad from depressing the one or more mechanically-activated switches, by physically engaging a surface of the touchpad that is opposite the touch surface of the touchpad, depending on whether the locking assembly is actuated.

19. The method of claim 18, wherein each of the one or more actuatable elements comprises a surface having an opening that encircles one of the one or more mechanically-activated switches.

20. The method of claim 18, wherein each of the one or more actuatable elements comprises a piezoelectric element.

21. A computing device comprising:

a plurality of input devices configured to receive one or more inputs from a user, the plurality of input devices comprising a touchpad having a touch surface, the touch surface configured to receive a touch input from the user;

one or more mechanically-activated switches positioned adjacent to the touchpad, the one or more mechanically-activated switches configured to be activated based at least in part on the touch input causing the touchpad to depress the one or more mechanically-activated switches;

a scissor mechanism coupled to a structure of the computing device and to the touchpad, the scissor mechanism comprising first and second linkages configured to be foldable at a pivoting point, the scissor mechanism further comprising a pre-loaded spring coupled to the pivoting point, the pre-loaded spring having a spring constant that enables the one or more mechanically-activated switches to be activated based on the touch input having a force in a range between 140 grams force and 190 grams force;

a locking assembly configured to selectively inhibit the touchpad from depressing the one or more mechanically-activated switches by inhibiting the scissor mechanism from folding depending on whether the locking assembly is actuated; and a controller configured to selectively actuate the locking assembly to inhibit the touchpad from depressing the one or more mechanically-activated switches based at least in part on the one or more inputs from the user.

* * * * *